United States Patent
Hirota

(10) Patent No.: US 9,412,773 B2
(45) Date of Patent: Aug. 9, 2016

(54) PHOTOELECTRIC CONVERSION APPARATUS, IMAGE PICKUP SYSTEM, AND METHOD FOR MANUFACTURING PHOTOELECTRIC CONVERSION APPARATUS

(71) Applicant: CANON KABUSHIKI KAISHA, Tokyo (JP)

(72) Inventor: Katsunori Hirota, Yamato (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 13/742,226

(22) Filed: Jan. 15, 2013

(65) Prior Publication Data
US 2013/0181268 A1 Jul. 18, 2013

(30) Foreign Application Priority Data
Jan. 18, 2012 (JP) .................................. 2012-008200

(51) Int. Cl.
*H01L 27/146* (2006.01)
*H01L 31/18* (2006.01)

(52) U.S. Cl.
CPC .... *H01L 27/14601* (2013.01); *H01L 27/14612* (2013.01); *H01L 27/14689* (2013.01); *H01L 31/1864* (2013.01)

(58) Field of Classification Search
None
See application file for complete search history.

(56) References Cited

U.S. PATENT DOCUMENTS

| | | | |
|---|---|---|---|
| 2003/0015763 A1 | 1/2003 | Yoneda | |
| 2004/0227196 A1 | 11/2004 | Yoneda | |
| 2004/0259380 A1* | 12/2004 | Fukuda | H01J 37/321 438/776 |
| 2005/0000361 A1 | 1/2005 | Kanda | |
| 2006/0172554 A1* | 8/2006 | Wang | H01L 21/28202 438/787 |
| 2006/0250511 A1* | 11/2006 | Lyu et al. | 348/294 |
| 2007/0161142 A1* | 7/2007 | Mouli et al. | 438/57 |
| 2007/0285543 A1* | 12/2007 | Uchida | H01L 27/14609 348/294 |
| 2008/0296644 A1* | 12/2008 | You et al. | 257/292 |
| 2009/0316484 A1 | 12/2009 | Sunamura | |
| 2010/0026866 A1 | 2/2010 | Matsumoto et al. | |
| 2010/0203667 A1* | 8/2010 | Hirota | H01L 27/14698 438/72 |

FOREIGN PATENT DOCUMENTS

| | | |
|---|---|---|
| CN | 1467824 A | 1/2004 |
| CN | 101079435 A | 11/2007 |
| CN | 101620994 A | 1/2010 |
| CN | 201845782 U | 5/2011 |
| JP | 6-268234 A | 9/1994 |
| JP | 10-4145 A | 1/1998 |
| JP | H11340338 A | 12/1999 |
| JP | 2000-269355 A | 9/2000 |
| JP | 2002305196 A | 10/2002 |
| JP | 2003-282567 A | 10/2003 |

(Continued)

*Primary Examiner* — Benjamin Sandvik
(74) *Attorney, Agent, or Firm* — Canon USA, Inc. IP Division

(57) ABSTRACT

A photoelectric conversion section contains a semiconductor element having a laminated structure which contains an electroconductor, a semiconductor, and an insulator provided between the electroconductor and the semiconductor, in which the insulator is a silicon oxide film containing nitrogen in a main portion located between the electroconductor and the semiconductor.

23 Claims, 10 Drawing Sheets

(56) References Cited

FOREIGN PATENT DOCUMENTS

| JP | 2004-266040 A | 9/2004 |
| JP | 2004311739 A | 11/2004 |
| JP | 2006040912 A | 2/2006 |
| JP | 2007042964 A | 2/2007 |
| JP | 2007-317741 A | 12/2007 |
| JP | 4327719 B2 | 9/2009 |
| JP | 2010-056515 A | 3/2010 |
| JP | 2010-206180 A | 9/2010 |

* cited by examiner

PHOTOELECTRIC CONVERSION APPARATUS, IMAGE PICKUP SYSTEM, AND METHOD FOR MANUFACTURING PHOTOELECTRIC CONVERSION APPARATUS

BACKGROUND OF THE INVENTION

1. Field of the Invention

The disclosure relates to an insulator in a laminated structure of an electroconductor, an insulator, and a semiconductor of a photoelectric conversion apparatus.

2. Description of the Related Art

A photoelectric conversion apparatus typified by a complementary metal oxide semiconductor (CMOS) image sensor is provided with a photoelectric conversion section and a signal processing section for processing signals from the photoelectric conversion section. The photoelectric conversion section can be constituted by a plurality of photoelectric conversion units each containing a metal-oxide-semiconductor field-effect-transistor (MOSFET).

Japanese Patent Laid-Open Nos. 2007-317741 and 2010-056515 disclose using a nitrided gate insulating film for the MOSFET of the photoelectric conversion unit. By the use of the nitrided gate insulating film, the dielectric constant thereof can be made higher than that of a gate insulating film containing silicon oxide formed by a general thermal oxidation method and the photoelectric conversion section can be operated well while reducing a leakage current.

However, when the nitrided gate insulating film is used as in Japanese Patent Laid-Open Nos. 2007-317741 and 2010-056515, the photoelectric conversion section has not been able to achieve sufficient performance in some cases. Thus, it is an object of the disclosure to improve the performance of the photoelectric conversion section.

SUMMARY OF THE INVENTION

According to a first aspect of this disclosure, a photoelectric conversion apparatus has a photoelectric conversion section, in which the photoelectric conversion section contains a semiconductor element having a laminated structure containing an electroconductor, a semiconductor, and an insulator provided between the electroconductor and the semiconductor, the insulator is a silicon oxide film containing nitrogen in a main portion located between the electroconductor and the semiconductor, the maximum nitrogen concentration of the main portion is higher than 0.10 atomic %, and the interface nitrogen concentration in the surface at the side of the semiconductor of the main portion is 0.10 atomic % or lower.

According to a second aspect in this disclosure, a method for manufacturing a photoelectric conversion apparatus having a photoelectric conversion section having a MOSFET in a first region and a signal processing section having an nMOSFET and a pMOSFET in a second region includes a silicon oxide film formation process of forming a first silicon oxide film in the first region of a silicon wafer and forming a second silicon oxide film in a certain portion of the second region of the silicon wafer, a nitriding process of simultaneously introducing nitrogen into the first silicon oxide film and the second silicon oxide film using a plasma nitriding method, and a patterning process of patterning a gate electrode of the MOSFET on the first silicon oxide film into which nitrogen is introduced and patterning gate electrodes of the nMOSFET and the pMOSFET on the second silicon oxide film into which nitrogen is introduced, in which the nitriding process is performed in such a manner that the maximum nitrogen concentration of the first silicon oxide film is 0.50 atomic % or more and the interface nitrogen concentration in the surface at the side of the silicon wafer of the first silicon oxide film is 0.10 atomic % or lower.

Further features of the disclosure will become apparent from the following description of exemplary embodiments with reference to the attached drawings.

DESCRIPTION OF THE EMBODIMENTS

Figure 1:
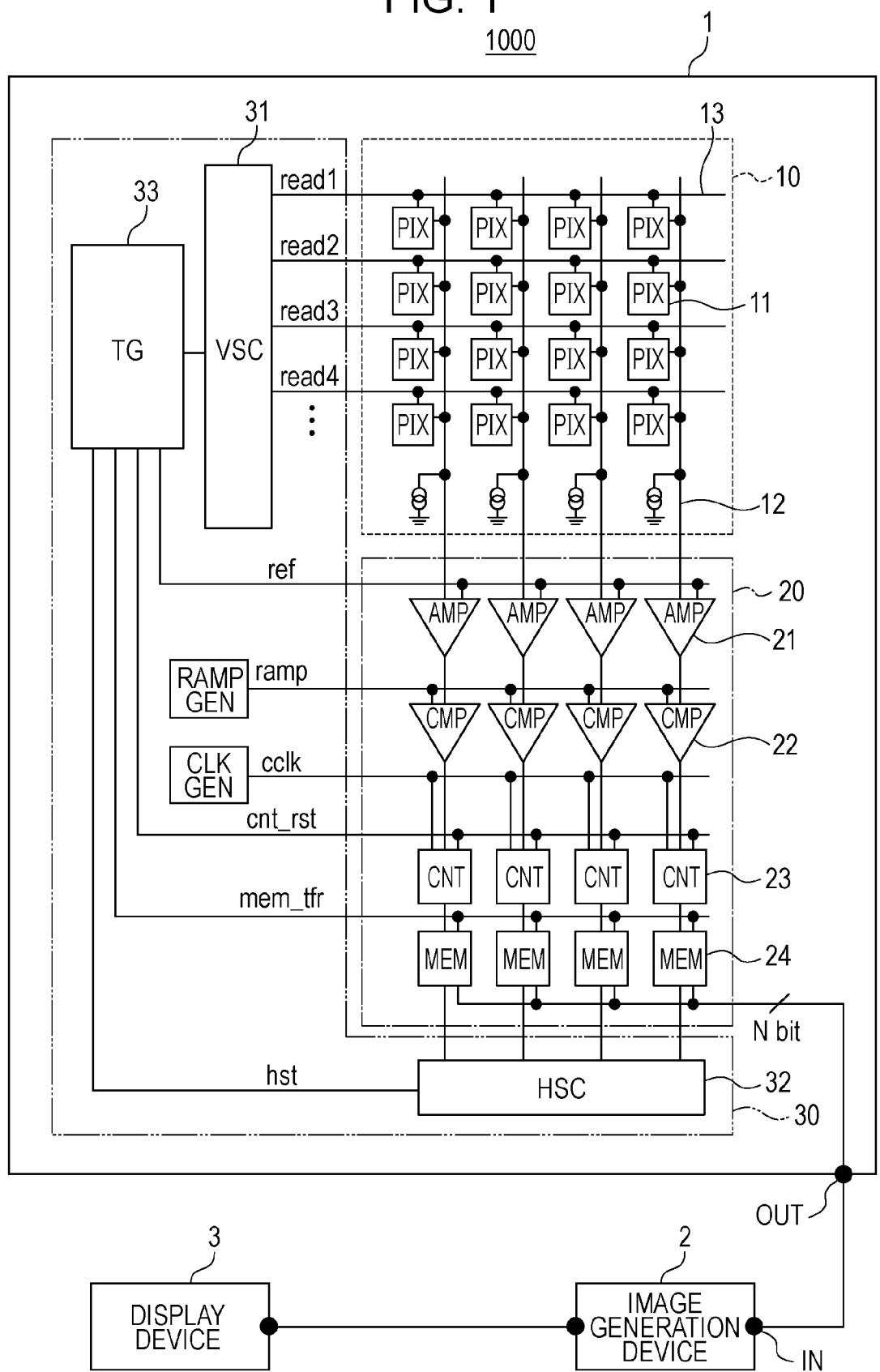
FIG. 1 is a block diagram of an example of a photoelectric conversion apparatus.

Hereinafter, embodiments of the disclosure are described with reference to the drawings. The figures can be referred to each other and components having the common function and the common structure are described using the same reference numerals.

An example of a photoelectric conversion apparatus 1 is described with reference to FIG. 1. The photoelectric conversion apparatus 1 is provided with a photoelectric conversion section 10. The photoelectric conversion apparatus of this embodiment is further provided with a signal processing section 20 and a drive section 30. Although the photoelectric conversion section 10 of this example is constituted by a plurality of photoelectric conversion units 11 which are two dimensionally arranged, the plurality of photoelectric conversion units 11 may be one dimensionally arranged. The photoelectric conversion unit 11 contains a photoelectric conversion portion. The photoelectric conversion section 10 contains vertical output lines 12 and horizontal scanning lines 13 connected to the photoelectric conversion unit 11 in a matrix shape. The vertical output lines 12 are connected to the signal processing section 20, and the horizontal scanning lines 13 are connected to the drive section 30. The vertical output lines 12 and the horizontal scanning lines 13 of this example are metal wiring lines containing copper or aluminum as the main ingredients. When the resistance of the wiring lines is made low, it is desirable to use a metal wiring line containing copper as the main ingredients. A region where the photoelectric conversion section 10 is disposed is referred to as a photoelectric conversion region (first region) and a region where the signal processing section 20 is disposed and a region where the drive section 30 is disposed are collectively referred to as a peripheral region (second region). The structures of the signal processing section 20 and the drive section 30 are described later.

Figure 2:
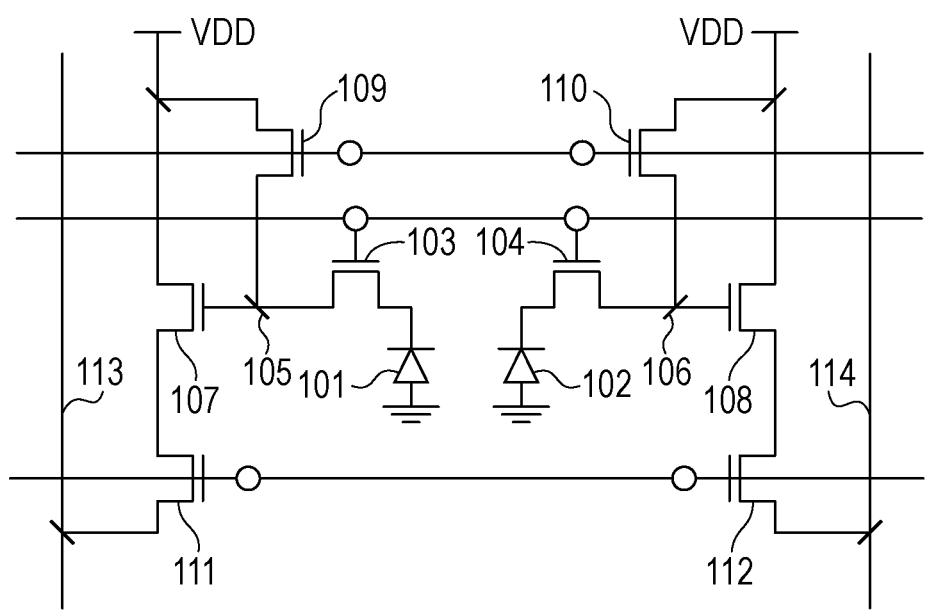
FIG. 2 is a circuit diagram of an example of a photoelectric conversion unit.
Figure 3A:
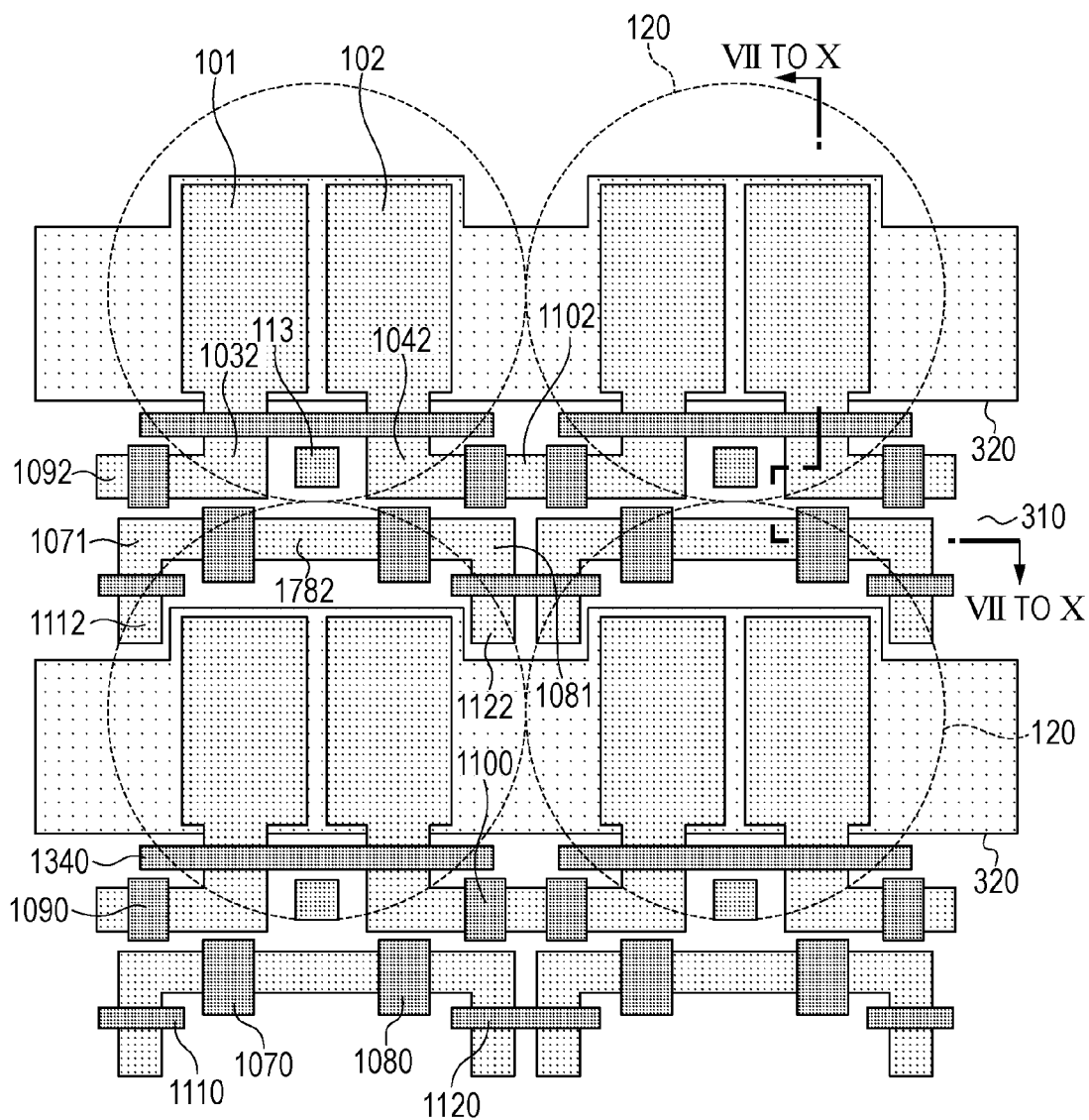
FIG. 3A is a plan schematic view of a photoelectric conversion section and FIG. 3B is a plan schematic view of a part of a signal processing section.

FIG. 2 illustrates an example of the circuit configuration of the photoelectric conversion unit 11. The photoelectric conversion unit 11 of this example has a structure such that two substantially equivalent circuits are combined. Hereinafter, the circuit in the left half in FIG. 2 is mainly described and the circuit in the right half corresponding to the circuit in the left half of the same photoelectric conversion unit 11 is supplementarily described with brackets. FIG. 3A is a plan schematic view illustrating the layout when four photoelectric conversion units 11 having the circuit configuration of FIG. 2 are arranged in two lines and two rows. In this layout, the first line and the second line have a translational symmetric relationship and the first row and the second row have a line symmetric relationship. Due to limitations of the drawings, some constituent components of each of the photoelectric conversion units 11 are described with reference to the photoelectric conversion unit 11 in the first row of the first line and some constituent components of the remaining constituent components are described with reference to the photoelectric conversion unit 11 in the first row of the second line.

The photoelectric conversion unit 11 contains two photoelectric conversion portions 101 (102). In this example, the photoelectric conversion portions 101 and 102 are photodiodes. In transfer transistors 103 (104), the photoelectric conversion portions 101 (102) serve as the source. A gate electrode 1340 of the transfer transistors 103 (104) forms one body in the transfer transistor 103 and the transfer transistor 104 but gate electrodes may be separately provided. To the gate electrode 1340 of the transfer transistors 103 (104), a first horizontal scanning line is connected. Drains 1032 (1042) of the transfer transistors 103 (104) are electrically connected to gate electrodes 1070 (1080) of amplification transistors 107 (108) through floating nodes 105 (106). The drains 1032 (1042) of the transfer transistors 103 (104) form a part of the floating nodes 105 (106) as floating diffusion. The floating nodes 105 (106) can include a wiring line for connecting the gate electrodes 1070 (1080) and the drains 1032 (1042) in addition to the drains 1032 (1042). In the floating nodes 105 (106), a potential according to the amount of signal charge generated in the photoelectric conversion portions 101 (102) appears. The amplification transistor 107 (108) generate electric signals according to the amount of the signal charges generated in the photoelectric conversion portions 101 (102) based on the potential of the floating nodes 105 (106).

The floating nodes 105 (106) are connected to the sources of reset transistors 109 (110). To gate electrodes 1090 (1100) of the reset transistors 109 (110), a second horizontal scanning line is connected. A drain 1782 of the amplification transistors 107 (108) and drains 1092 (1102) of the reset transistors 109 (110) are regulated to the power supply potential VDD through a power source line. The reset transistors 109 (110) reset signal charges generated in the photoelectric conversion portions 101 (102) through the floating nodes 105 (106). The reset transistors 109 (110) reset the gates of the amplification transistors 107 (108) to the power supply potential VDD through the floating nodes 105 (106).

The amplification transistor 107 and the amplification transistor 108 share the drain 1782 thereof. The drains 1032 (1042) of the transfer transistors 103 (104) also serve as the source of the reset transistor 109.

The sources 1071 (1081) of the amplification transistors 107 (108) are connected to vertical output lines 113 (114) through switch transistors 111 (112). The sources 1071 (1081) of the amplification transistors 107 (108) also serve as the drains of the switch transistors 111 (112). To the gate electrodes 1110 (1120) of the switch transistors 111 (112), a third horizontal scanning line is connected. To the sources 1112 (1122) of the switch transistors 111 (112), vertical output lines 113 (114) are connected. The switch transistors 111 (112) control ON or OFF of an output from the photoelectric conversion unit 11 to the vertical output line 12. By the switch transistors 111 (112), the photoelectric conversion unit 11 which obtains signals is selected from the plurality of photoelectric conversion units 11. The switch transistors 111 (112) can also be omitted. The transfer transistors 103 (104) can be omitted and the photoelectric conversion portions 101 (102) and the gate electrodes 1070 (1080) of the amplification transistors 107 (108) can also be electrically connected to each other without a transfer transistor.

In this layout, an insulating isolation portion 310 and a diffusion isolation portion 320 are used for element isolation between the photoelectric conversion units 11 or element isolation in the photoelectric conversion unit 11. Specifically, element isolation of the photoelectric conversion portions in the two photoelectric conversion units 11 and element isolation of the two photoelectric conversion portions 101 and 102 in the photoelectric conversion unit 11 are achieved by the diffusion isolation portion 320. With respect to the transistors of the photoelectric conversion units 11, a non-hatched portion in FIG. 3A represents the insulating isolation portion 310. Element isolation of the transfer transistors 103 (104) and the reset transistors 109 (110) and element isolation of the amplification transistors 107 (108) and the switch transistors 111 (112) are achieved by the insulating isolation portion 310, and the elements can also be connected through a metal wiring line.

One optical unit corresponding to one photoelectric conversion unit 11 can be disposed. The optical unit can contain at least one microlens of a top lens or an inner-layer lens. In FIG. 3A, the outline of a top lens 120 is schematically illustrated as the optical unit. Moreover, one optical unit can contain a color filter of one color. Color filters of a plurality of colors are arranged for each photoelectric conversion unit, whereby a multicolor filter can be constituted. As the multicolor filter, one in which color filters of three colors of red, green, and blue are arranged in a Bayer manner can be typically used. In this example, a red color filter corresponds to the photoelectric conversion unit 11 on the first row of the second line. A green color filter corresponds to the photoelectric conversion unit 11 on the first row of the first line and the photoelectric conversion unit 11 on the second row of the second line. A blue color filter corresponds to the photoelectric conversion unit 11 on the second row of the first line.

As is understood from FIG. 3A, the photoelectric conversion unit 11 of this example has the two photoelectric conversion portions 101 and 102 corresponding to one optical unit. When increasing the area of the photoelectric conversion portions to achieve a large area to thereby improve the sensitivity, an improvement of transfer efficiency is achieved by dividing the photoelectric conversion portions into a plurality of portions, and separately transmitting signal charges from each of the plurality of photoelectric conversion portions 101 and 102. Moreover, focal detection can also be achieved by separately outputting signal charges of the plurality of photoelectric conversion portions 101 and 102 of the one photoelectric conversion unit 11. It is a matter of course that only one photoelectric conversion portion can also be made to correspond to one optical unit.

The transfer transistors 103 (104), the amplification transistors 107 (108), the reset transistors 109 (110), and the switch transistors 111 (112) which constitute the photoelectric conversion unit 11 are semiconductor elements having a so-called MOS structure. These transistors are insulated gate field effect transistors (MOSFET: Metal-Oxide-Semiconductor Field-Effect-Transistor) having a source and a drain in addition to a gate having the MOS structure. The MOS structure as used herein means a laminated structure containing an electroconductor, a semiconductor, and an insulator provided between the electroconductor and the semiconductor. In this embodiment, the gate electrode which is the electroconductor of the laminated structure may be a metal electrode and is suitably a polysilicon electrode. As described later, a gate insulating film which is an insulator of a laminated structure in a MOSFET is not a pure silicon oxide film but a silicon oxide film containing nitrogen. Hereinafter, the silicon oxide film containing nitrogen is sometimes referred to as a silicon oxynitride film for convenience. The nitrogen of the silicon oxide film containing nitrogen may be or may not be combined with silicon. The semiconductor of the laminated structure in the MOSFET is a channel region in which a channel is formed.

Figure 4A:
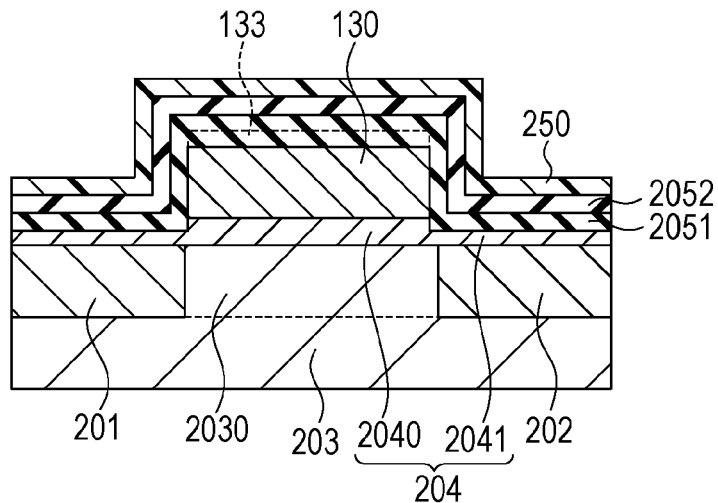
FIG. 4A is a cross-sectional schematic view of an example of a photoelectric conversion MOSFET.

FIG. 4A is a cross-sectional schematic view of the transistor of the photoelectric conversion unit 11. Hereinafter, the MOSFET of the photoelectric conversion unit 11 is referred to as a "photoelectric conversion MOSFET" (It is noted that the photoelectric conversion MOSFET itself does not perform photoelectric conversion.). The structure of the photoelectric conversion MOSFET illustrated in FIG. 4A is applicable to all of the transfer transistors 103 (104), the amplification transistors 107 (108), the reset transistors 109 (110), and the switch transistors 111 (112). Among the above, the structure is suitably applied to the transfer transistors 103 (104) and the amplification transistors 107 (108). In this example, all of the transistors (4×2) of the photoelectric conversion units 11 are the photoelectric conversion MOSFETs described with reference to the structure illustrated in FIG. 4A.

The photoelectric conversion MOSFET of this example has a silicon oxide film 204 which functions as a gate insulating film. In detail, the silicon oxide film 204 has at least a main portion 2040 located between a gate electrode 130 and a channel region 2030 of the photoelectric conversion MOSFET. The MOS structure containing the gate electrode 130, the main portion 2040, and the channel region 2030 forms the gate of the photoelectric conversion MOSFET. The channel region 2030 is a part of the semiconductor region and is a portion located between a source 201 and a drain 202 of the semiconductor region illustrated as a well region 203 herein. The semiconductor region is not limited to the well region. The silicon oxide film 204 of this example has extension portions 2041 extending from the main portion 2040 onto the source 201 and the drain 202 of the photoelectric conversion MOSFET. The extension portions 2041 are described later.

The surface at the side of the gate electrode 130 of the main portion 2040 is referred to as an upper surface of the main portion 2040. The upper surface of the main portion 2040 contacts the undersurface of the gate electrode 130 to form an interface with the gate electrode 130. The surface at the side of the channel region 2030 of the main portion 2040 is referred to as an under surface of the main portion 2040. The under surface of the main portion 2040 contacts the channel region 2030 to form an interface with the channel region 2030. The channel formed in the channel region 2030 sometimes contacts the under surface of the main portion 2040 and is sometimes formed apart from the under surface of the main portion 2040. The latter case can be achieved by forming the channel region 2030 with an buried channel structure. The interface between the silicon oxide film 204 and the channel region 2030, which is the under surface of the main portion 2040, can be defined based on the relationship between the oxygen concentration and the silicon concentration. In the composition change in the direction from the main portion 2040 to the channel region 2030, the ratio of oxygen concentration to the silicon concentration can sharply decrease at the interface between the silicon oxide film 204 and the channel region 2030. The relationship between the oxygen concentration and the silicon concentration can be grasped from the oxygen concentration distribution in the silicon oxide film 204. The oxygen concentration distribution in the silicon oxide film 204 can be measured by a secondary ion mass spectrometry (SIMS). Specifically, the position where the secondary ionic strength of the oxygen detected in the SIMS measurement reaches ½ of the peak intensity can be determined as the interface between the silicon oxide film 204 and the channel region 2030. The main portion 2040 may have an oxygen concentration distribution having no clear peak. For example, a region where the maximum oxygen concentration is achieved may extend with a fixed width in the thickness direction.

The thickness T of the main portion 2040 is the distance from the upper surface to the under surface of the main portion 2040 and is equal to the distance from the gate electrode 130 to the channel region 2030. The practical thickness T of the main portion 2040 is 1.0 nm or more and 15 nm or lower. The thickness T of the main portion 2040 is suitably 5.0 nm or more and is also suitably 10 nm or lower. The thickness T of the main portion 2040 of this example is 7.5 nm. The position where the secondary ionic strength of oxygen described above reaches the peak intensity is the upper surface of the main portion 2040 or a position which is somewhat distant from the upper surface. The position which is somewhat apart from the upper surface is, for example, a position between a position (intermediate surface) where the distance from the upper surface of the main portion 2040 becomes T/2 and the upper surface.

Figure 5A:
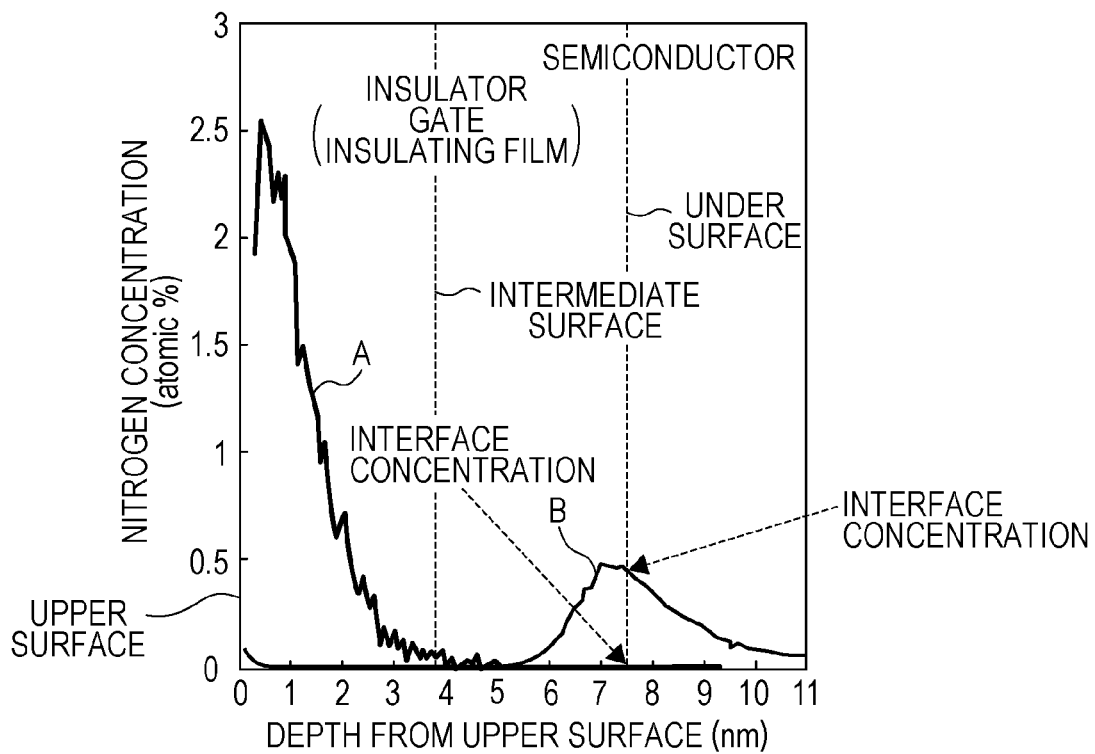
FIG. 5A is a view explaining a nitrogen concentration distribution of a thick gate insulating film and FIG. 5B is a view explaining a nitrogen concentration distribution of a thin gate insulating film.

The silicon oxide film 204 contains nitrogen at least in the main portion 2040. The concentration of the nitrogen contained in the silicon oxide film 204 of this embodiment is not uniform from the upper surface to the under surface of the main portion 2040 and has a distribution in the lamination direction. This nitrogen concentration distribution is a nitrogen concentration distribution in which the maximum nitrogen concentration of the main portion 2040 is higher than the nitrogen concentration in the under surface of the main portion 2040, i.e., the interface nitrogen concentration. The nitrogen concentration distribution of the silicon oxide film 204 can be measured using an X ray photoelectron spectroscopy (XPS), a secondary ion mass spectrometry (SIMS), an inductively coupled plasma mass spectrometry (ICP-MS), a Rutherford backscattering spectrometry (RBS), or the like. The silicon oxide film 204 containing nitrogen of this example can be formed using a plasma nitriding method. The line A of FIG. 5A illustrates a distribution of the nitrogen concentration in the main portion 2040 of the photoelectric conversion MOSFET of this example. The nitrogen concentration distribution illustrated in FIG. 5A is measured by SIMS. As an SIMS device, IMS-4F (Type) manufactured by Cameca Instruments, Inc., and SIMS6650 manufactured by ULVAC-PHI (Type) can be used. XPS measurement was also performed by RVX1000 manufactured by ReVera (Type). Then, the nitrogen concentration distribution obtained by the SIMS measurement and the nitrogen concentration distribution obtained by the XPS measurement showed good coincidence. As a reference example, the line B of FIG. 5A illustrates a distribution of the nitrogen concentration when the main portion 2040 of the photoelectric conversion MOSFET is formed using a general thermal oxynitriding method. In the thermal oxynitriding, $N_2O$ gas is decomposed by thermal energy, so that oxidation by oxygen and nitriding by nitrogen simultaneously occur, and therefore a concentration distribution having the peak nitrogen concentration near the interface is obtained. By performing the thermal oxidation method, and then performing the thermal oxynitriding method while changing the gas type, a similar nitrogen concentration distribution can be obtained. The maximum nitrogen concentration in the nitrogen concentration distribution of this example has a clear peak (peak nitrogen concentration). Therefore, the following explanation is given while defining the maximum nitrogen concentration as the peak nitrogen concentration. The main portion 2040 may have a nitrogen concentration distribution having no clear peak. For example, the region when the maximum nitrogen concentration is achieved may extend with a fixed width in the thickness direction.

The practical peak nitrogen concentration $C_p$ in the main portion 2040 is 0.50 atomic % or more. The peak nitrogen concentration $C_p$ is suitably 10.00 atomic % or lower and more suitably 5.00 atomic % or lower. In this example, the peak nitrogen concentration $C_p$ in the main portion 2040 is 2.55 atomic %, which is lower than 5.00 atomic %. In the reference example, the peak nitrogen concentration of the main portion 2040 is 0.48 atomic %, which is lower than 0.50 atomic %.

Thus, due to the fact that the main portion 2040 of the silicon oxide film 204 as a gate insulating film contains nitrogen, the dielectric constant of the main portion 2040 is high as compared with the case where a silicon oxide film not containing nitrogen is used. As a result, even when the thickness T of the main portion 2040 is made relatively large, the capacity of the MOS structure can be increased. A leak current can be reduced by making the thickness T of the main portion 2040 is relatively large.

Particularly in the transfer transistors 103 (104), by increasing the capacity of the gate, the potential of the drains 1032 (1042) can be made high when the transfer transistors 103 (104) are turned ON. As a result, the transfer efficiency improves.

In the amplification transistors 107 (108), by increasing the capacity of the gate, the drivability of the amplification transistors 107 (108) becomes high, so that a large current can be applied. As a result, the operation speed of the photoelectric conversion unit 11 improves.

The nitrogen concentration $C_i$ in the under surface of the main portion 2040, i.e., the interface nitrogen concentration, is 0.10 atomic % or lower and more suitably 0.05 atomic % or lower. The nitrogen concentration of lower than 0.01 atomic % can be regarded as that the nitrogen concentration is 0 atomic %. The interface nitrogen concentration of this example is lower than 0.01 atomic % In the reference example, the interface nitrogen concentration of the main portion 2040 is 0.45 atomic %.

Figure 6A:
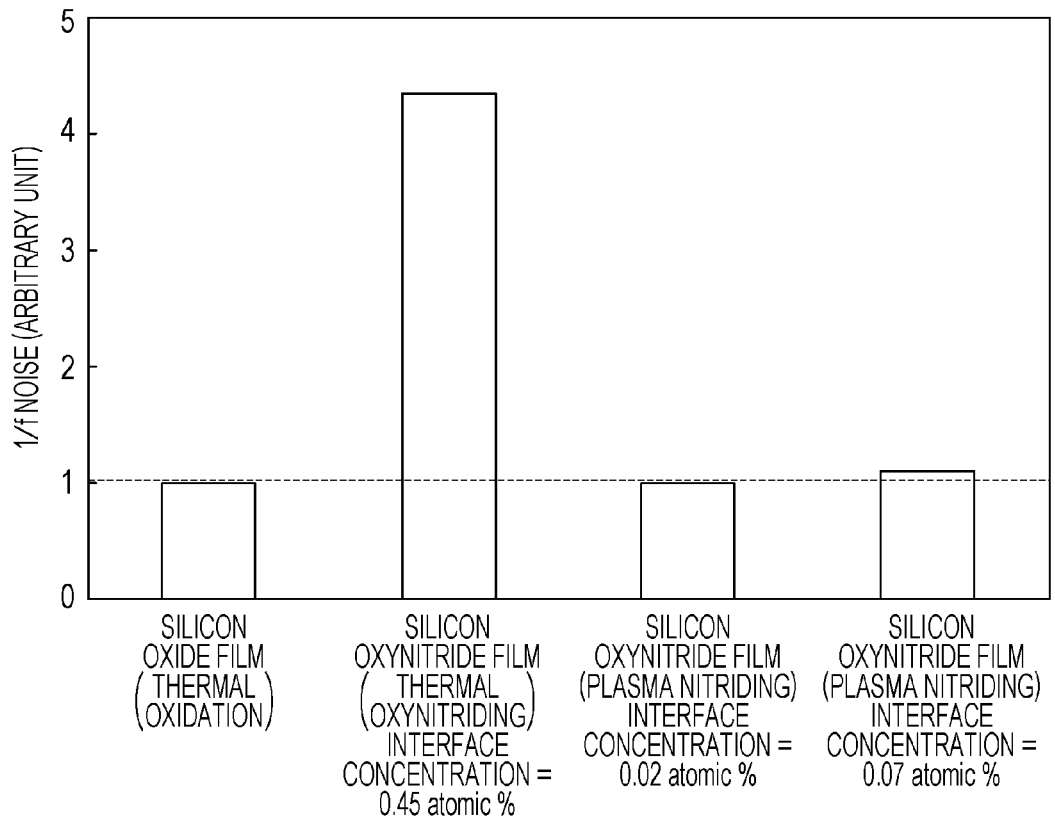
FIG. 6A is a view explaining the relationship between the interface nitrogen concentration and the 1/f noise and FIG. 6B is a view explaining the relationship between the interface nitrogen concentration and the refractive index.

Thus, by making the interface nitrogen concentration of the main portion 2040 of the silicon oxide film 204 as a gate insulating film low, the level of the interface between the main portion 2040 and the channel region 2030, i.e., the interface level, decreases. In the transfer transistors 103 (104) treating signal charges, the high interface level can cause dark current. By adjusting the interface nitrogen concentration to 0.10 atomic % or lower as in this embodiment, the dark current in the transfer transistors 103 (104) can be reduced. Moreover, the high interface level can cause 1/f noise in the amplification transistors 107 (108). FIG. 6A illustrates the 1/f noise when the nitrogen of the main portion 2040 is formed by a thermal oxynitriding method and the interface nitrogen concentration is 0.45 atomic % as a reference example. By adjusting the interface nitrogen concentration to 0.10 atomic % or lower, the 1/f noise level can be made equivalent to that of the silicon oxide film formed using a thermal oxidation method. FIG. 6A illustrates the 1/f noise in Example in which the nitrogen of the main portion 2040 is formed by a plasma nitriding method and the interface nitrogen concentration is adjusted to 0.02 atomic % and in Example in which the nitrogen of the main portion 2040 is formed by a plasma nitriding method and the interface nitrogen concentration is adjusted to 0.07 atomic %. Although not illustrated in FIG. 6A, also in the case where the interface nitrogen concentration is 0.10 atomic %, a 1/f noise level equivalent to that of Example in which the interface nitrogen concentration is adjusted to 0.07 atomic % was obtained. It is considered from FIG. 6A that the interface nitrogen concentration and the 1/f noise have an exponential relationship rather than a linear relationship. More specifically, when the interface nitrogen concentration is 0.10 atomic % or lower, a 1/f noise level which should be said to be equivalent to that of the silicon oxide film which is formed using a thermal oxidation method and substantially does not contain nitrogen can be achieved.

The position where the peak nitrogen concentration $C_p$ is achieved in the main portion 2040 is suitably located at the gate electrode 130 side in terms of noise reduction, rather than a virtual surface (intermediate surface) located at the equal distance from the upper surface and the under surface of the main portion 2040. More specifically, when the distance from the upper surface of the position where the peak nitrogen concentration $C_p$ is achieved is defined as $D_p$, it is suitable to satisfy $D_p<T/2$. At the position where the peak nitrogen concentration $C_p$ is achieved, it is more suitable to satisfy $0 \leq D_p \leq T/4$. In this example, the distance $D_p$ is lower than 1.0 nm.

The position where the nitrogen concentration reaches ½ of the peak nitrogen concentration $C_p$ is suitably located at the gate electrode side rather than the intermediate surface. More specifically, when defining the distance from the upper surface of the position where the nitrogen concentration reaches ½ of the peak nitrogen concentration as $D_h$, it is suitable to satisfy $D_p<D_h<T/2$. In this example, $D_h$ is 1.5 nm and $D_h<T/4$ is also satisfied.

The nitrogen concentration at the position where the distance from the upper surface reaches T/2 of the main portion 2040, i.e., in the intermediate surface described above, is suitably lower than ½ of the peak nitrogen concentration. Furthermore, it is suitable that the nitrogen concentration at the side of the channel region 2030 relative to the intermediate surface does not exceed the nitrogen concentration in the intermediate surface. The nitrogen concentration in the intermediate surface is suitably lower than 0.50 atomic % and more suitably 0.10 atomic % or lower. It is suitable that the nitrogen concentration at the side of the channel region 2030 relative to the intermediate surface does not exceed 0.50 atomic %. When the nitrogen concentration in the intermediate surface is 0.01 atomic % or lower, the width (thickness) in the depth direction of a region containing nitrogen is small. It is suitable that nitrogen is somewhat present also in the intermediate surface. The nitrogen concentration in the intermediate surface is suitably 0.01 atomic % or more and more suitably 0.05 atomic % or more. In this example, the nitrogen concentration in the intermediate surface is 0.07 atomic %, and the nitrogen concentration at the side of the channel region 2030 relative to the intermediate surface does not exceed 0.10 atomic %.

Thus, it is suitable to have a concentration distribution such that the nitrogen concentration sharply decreases from the position where the peak nitrogen concentration is achieved to the intermediate surface of the main portion 2040 and the nitrogen concentration from the intermediate surface to the under surface is very low.

The extension portions 2041 are described. The extension portions 2041 each also have an upper surface and an under surface. The under surfaces of the extension portions 2041 are a surface at the side of the source 201 of the extension portion 2041 and a surface at the side of the drain 202 of the extension portion 2041. The extension portion 2041 may be formed on only one of the drain 202 and the source 201 and is sometimes not provided thereon. The under surfaces of the extension portions 2041 are located in the substantially same plane as the under surface of the main portion 2040. The under surfaces of the extension portions 2041 may be an interface between the extension portions 2041 and the source 201 or drain 202.

Although the extension portions 2041 may have the same thickness and nitrogen concentration distribution as those of the main portion 2040, it is suitable for the extension portions 2041 to have a thickness and a nitrogen concentration distribution different from those of the main portion 2040. In this embodiment, the thickness T' of the extension portion 2041 is smaller than the thickness T of the main portion 2040. In this example, the thickness T' of the extension portion 2041 is 4.5 nm. The nitrogen concentration in the under surfaces of the extension portions 2041, i.e., the interface nitrogen concentration, is 0.10 atomic % and suitably 0.05 atomic % or lower. The interface nitrogen concentration of the extension portions 2041 of this example is lower than 0.01 atomic %.

The typical peak nitrogen concentration of the extension portions 2041 is 10.00 atomic % or lower similarly as in the main portion 2040 and is suitably 1.00 atomic % or lower and more suitably 0.50 atomic % or lower. The peak nitrogen concentration of the extension portions 2041 is also suitably ½ or lower of the peak nitrogen concentration of the main portion 2040. In this example, the peak nitrogen concentration of the extension portions 2041 is lower than 0.20 atomic %. The position where the peak nitrogen concentration is achieved in the extension portions 2041 is suitably located at the upper surface side relative to the intermediate surfaces of the extension portions 2041.

Figure 6B:
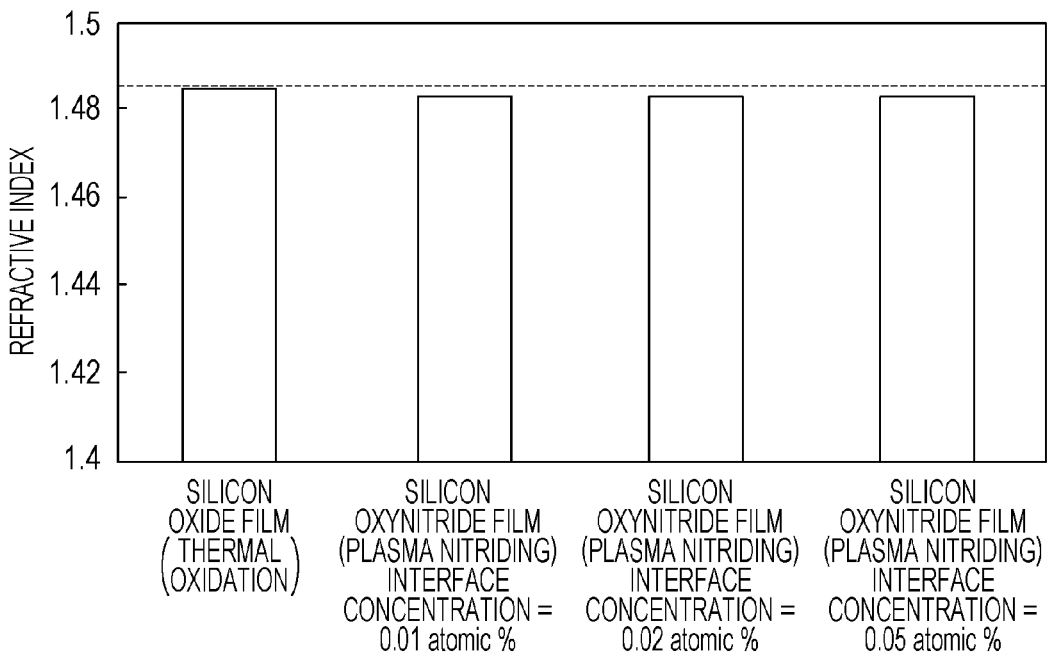

By adjusting the interface nitrogen concentration in the extension portions 2041 to 0.10 atomic % or lower in the transfer transistors 103 (104), dark current can be reduced for the same reason (reduction in interface level) as that of the main portion 2040. Moreover, by making the peak nitrogen concentration and the interface nitrogen concentration of the extension portions 2041 on the photoelectric conversion portions 101 (102) sufficient low, the refractive index of the extension portions 2041 can be made equivalent to that of a silicon oxide film which is formed using a thermal oxidation method and substantially does not contain nitrogen. As a result, unnecessary light reflection in the extension portions 2041 can be reduced, and the sensitivity can be improved. Moreover, a variation in the spectrum characteristics of each of the photoelectric conversion units 11 in which color filters of different colors are disposed can be reduced. FIG. 6B illustrates the refractive index when the interface nitrogen concentration is set to 0.01 atomic %, 0.02 atomic %, and 0.05 atomic %. When the interface nitrogen concentration is 0.05 atomic % or lower, a refractive index equivalent to that of a silicon oxide film which is formed by thermal oxidation and substantially does not contain nitrogen is obtained. A result is obtained in which the refractive index of the silicon oxynitride film illustrated in FIG. 6B is lower than that of a silicon oxide film which is formed by thermal oxidation and substantially does not contain nitrogen. In the photoelectric conversion portions 101 (102) which are the sources of the transfer transistors 103 (104), the area covered with the extension portions 2041 is large as compared with the drains 1032 (1042) of the transfer transistors 103 (104). Therefore, the influence of the presence of nitrogen in the extension portions 2041 becomes higher in the photoelectric conversion portions 101 (102) than in the drains 1032 (1042). Therefore, it is suitable to make the peak nitrogen concentration particularly in the extension portions 2041 on the photoelectric conversion portions 101 (102) lower than the peak nitrogen concentration of the main portion 2040 as in this embodiment.

Although the photoelectric conversion MOSFET of this example is an nMOSFET and may be a pMOSFET or both the nMOSFET and the pMOSFET may be present. In this example, the signal charges are electrons but the signal charges may be positive holes. When the gate electrode 130 of the photoelectric conversion MOSFET which is an nMOSFET contains polysilicon, the gate electrode 130 is suitably a non-doped type or an n-type. When the gate electrode 130 is a p-type, boron (B) is typically an impurity. However, boron is easily diffused, which causes noise. Therefore, noise can be suppressed by making the gate electrode 130 a non-doped type or an n-type. However, when making the gate electrode 130 a non-doped type, the gate electrode 130 is easily depleted. Therefore, it is more suitable to make the gate electrode 130 an n-type. When making the gate electrode 130 of the photoelectric conversion MOSFET an n-type, a suitable range of an impurity concentration of the gate electrode 130 is $1 \times 10^{21}$ to $1 \times 10^{22}$ (atoms/cm$^3$) when using phosphorus (P) as impurities. A suitable range of the sheet resistance of the gate electrode 130 is 10 to 1000 Ω/□. When using nitrogen (N) or arsenic (As) as impurities, the impurity concentration may be determined in such a manner as to achieve the sheet resistance in this range.

The laminated film illustrated in FIG. 4A covering the photoelectric conversion MOSFET is described. The laminated film of this example contains a first silicon oxide layer 2051, an inorganic insulating member 133, a silicon nitride layer 2052, and a second silicon oxide layer 250.

The first silicon oxide layer 2051 which is relatively thin and covers the source 201, the gate electrode 130, and the drain 202 is provided. The extension portions 2041 are located between the first silicon oxide layer 2051 and the source 201 and between the first silicon oxide layer 2051 and the drain 202 and form the interface with the first silicon oxide layer 2051. The first silicon oxide layer 2051 is suitably thicker than the main portion 2040 and/or the extension portions 2041. The thickness of the first silicon oxide layer 2051 is 10 nm in this example. Between the first silicon oxide layer 2051 and the upper surface of the gate electrode 130, the inorganic insulating member 133 thicker than the first silicon oxide layer 2051 is provided. As materials of the inorganic insulating member 133, silicon nitride, silicon oxide, or silicon carbide can be used and it is suitable to use silicon oxide. The thickness of the inorganic insulating member 133 is suitably 10 to 100 nm and is 30 nm in this example. The silicon nitride layer 2052 which is relatively thick and covers the first silicon oxide layer 2051 is provided. The silicon nitride layer 2052 is suitably thicker than the first silicon oxide layer 2051. The thickness of the silicon nitride layer is suitably 10 to 100 nm and is 50 nm in this example. The second silicon oxide layer 250 which is relatively thick and covers the silicon oxide layer 2051 is provided. The thickness of the second silicon oxide layer 250 is thicker than the first silicon oxide layer 2051, and is suitably 10 to 100 nm and is 50 nm in this example.

In such a laminated film structure on the photoelectric conversion MOSFET, the silicon nitride layer 2052 can function as a passivation layer. The first silicon oxide layer 2051 can function as a buffer layer which prevents the silicon nitride layer 2052 from contacting the extension portions 2041. Due to such silicon nitride layer 2052 and first silicon oxide layer 205, noise is further reduced.

This laminated film structure is particularly suitably applied to the transfer transistors 103 (104). The silicon nitride layer 2052 located above the photoelectric conversion portions 101 (102) which are the sources of the transfer transistors 103 (104) can have a function of reducing reflection of light travelling to the photoelectric conversion portion 101. The inorganic insulating member 133 located above the gate electrode 1340 of the transfer transistors 103 (104) can have a function of reducing the penetration of light travelling to the gate electrode 1340.

An example of the signal processing section 20 and the drive section 30 of the photoelectric conversion apparatus 1 is described with reference to FIG. 1. The signal processing section 20 of this example contains amplifiers 21, comparators 22, counters 23, and memories 24. The drive section 30 of this example contains a vertical scanning circuit 31, a horizontal scanning circuit 32, a timing generator 33, a ramp generator 34, and a clock generator 35. The signal processing section 20 performs noise reduction processing, AD conversion processing, and the like to electric signals output through the vertical output lines 12 from the photoelectric conversion section 10. The drive section 30 drives the photoelectric conversion section 10 or drives the signal processing section 20 through the horizontal scanning lines 13.

A signal output to the vertical output line 12 from the photoelectric conversion unit 11 is input into the amplifier 21, and the amplifier 21 performs CDS processing to the signal from the vertical output line 12 based on a standard signal ref from the timing generator 33. The comparator 22 compares an output signal of the amplifier 21 with a ramp signal from the ramp generator 34, and then, at the moment when the potentials of both the signals become the same potential, the output of the comparator 22 is inverted. The counter 23 performs count-up operation based on the clock from the clock generator 35, and stops the count-up operation when the output of the comparator 22 is inverted. Thus, with respect to the count value of each row, values proportional to the time until the output of the comparator is inverted are held. More specifically, the values are values proportional to the output of the photoelectric conversion unit. The memory 24 takes in the count values held in the counter 23 when a mem_tfr pulse is input from the timing generator 33. When a hst pulse is input from the timing generator 33, the horizontal scanning circuit 32 successively scans the values taken into each memory 24 and outputs the same. Thus, the output signal of the amplifier 21 is AD converted based on the ramp signal of the ramp generator. When a cnt_rst pulse is input from the timing generator 33, the counter 23 is reset to the initial value, so that the process proceeds to an AD conversion operation of the following line. N stages of the memories 24 are provided for each row, and an Nbit signal is output from an output OUT of the photoelectric conversion apparatus 1.

An image pickup system 1000, such as a still camera and a video camera, can be constructed using the photoelectric conversion apparatus 1 as an image pickup device. The image pickup system 1000 has the photoelectric conversion apparatus 1 and an image generation device 2 which generates an image based on an output signal from the photoelectric conversion apparatus 1. In this example, the output signal from the photoelectric conversion apparatus 1 is a digital signal and may be an analog signal. The image pickup system 1000 can contain an image display device 3 which displays the image generated by the image generation device 2. The image pickup system 1000 can also contain an image recording device which records the image generated by the image generation device 2.

The signal processing section 20 and the drive section 30 are constituted by a large number of MOSFETs. The MOSFETs of the signal processing section 20 and the drive section 30 are referred to as "peripheral MOSFETs". The peripheral MOSFETs include an nMOSFET and a pMOSFET. The nMOSFET and the pMOSFET of the peripheral MOSFETs are referred to as a "peripheral nMOSFET" and a "peripheral pMOSFET", respectively. The peripheral nMOSFET can further include a first peripheral nMOSFET and a second peripheral nMOSFET. The peripheral pMOSFET can include a first peripheral pMOSFET and a second peripheral pMOSFET. The first peripheral nMOSFET and the first peripheral pMOSFET are collectively referred to as a first peripheral MOSFET and the second peripheral nMOSFET and the second peripheral pMOSFET are collectively referred to as second peripheral MOSFET.

The first peripheral MOSFET is driven by applying a relatively low voltage to the gate. In this example, the first peripheral MOSFET is driven at 1.8 V. The second peripheral MOSFET is driven by applying a voltage higher than that of the first peripheral MOSFET to the gate. In this example, the second MOSFET is driven at 3.3 V.

The first peripheral nMOSFET and the second peripheral nMOSFET and the first peripheral pMOSFET and the second peripheral pMOSFET are used according to the structure and the operation method of a circuit. In this example, the comparators 22, the counters 23, and the memories 24 of the signal processing section 20 contain at least one of the first peripheral nMOSFET and the first peripheral pMOSFET. The horizontal scanning circuit 32, the timing generator 33, the ramp generator, and the clock generator of the drive section 30 contain at least one of the first peripheral nMOSFET and the first peripheral pMOSFET. In this example, the amplifiers 21 of the signal processing section 20 and the vertical scanning circuit 31 of the drive section 30 contain at least one of the second peripheral nMOSFET and the second peripheral pMOSFET. A preceding circuit of the comparators 22 (circuit at the side of the amplifiers 21) contains at least one of the second peripheral nMOSFET and the second peripheral pMOSFET. A subsequent circuit of the comparators 22 (circuit at the side of the counters 23) contains at least one of the first peripheral nMOSFET and the first peripheral pMOSFET.

In the signal processing section 20 and the drive section 30, the peripheral nMOSFETs and the peripheral pMOSFETs can be complementarily arranged to be used as a CMOS (Complementary MOS) circuit. It is a matter of course that the peripheral nMOSFETs and the peripheral pMOSFETs can also be independently used in the signal processing section 20 and the drive section 30.

Figure 3B:
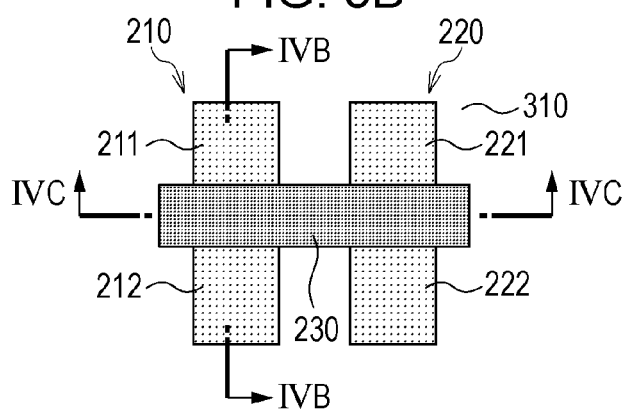

FIG. 3B is a plan schematic view of the CMOS circuit containing a peripheral nMOSFET 210 and a peripheral pMOSFET 220. In this example, the peripheral nMOSFET 210 is the first peripheral nMOSFET and the peripheral pMOSFET 220 is the first peripheral pMOSFET, and a CMOS circuit employing the second peripheral nMOSFET and the second peripheral pMOSFET can also be used. The peripheral nMOSFET 210 has an n-type source 211 and an n-type drain 212. The peripheral pMOSFET 220 has a p-type source 221 and a p-type drain 222. In this example, gate electrodes 230 thereof form one body in the peripheral nMOSFET 210 and the peripheral pMOSFET 220. In place of the structure, the gate electrodes of the peripheral nMOSFET 210 and the peripheral pMOSFET 220 are separately provided, and then the gate electrodes can also be connected by wiring.

Figure 4B:
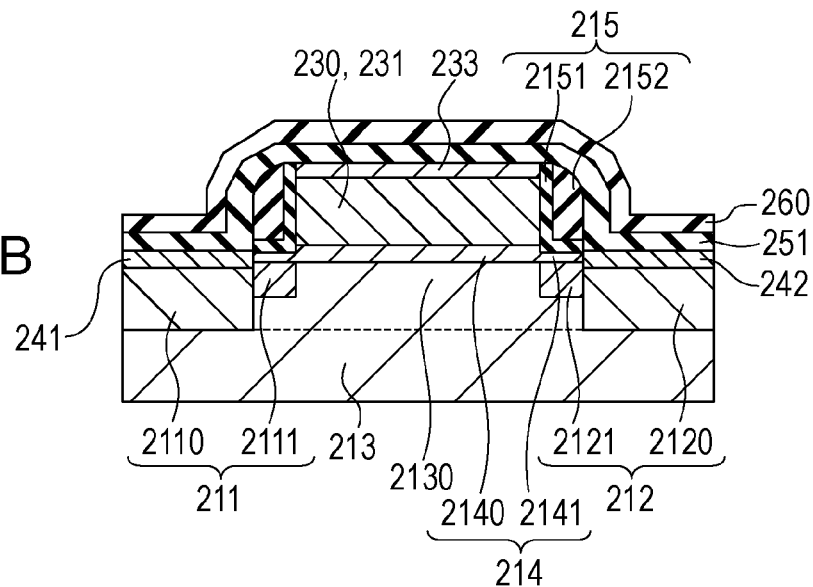
FIG. 4B is a cross-sectional schematic view of an example of a peripheral MOSFET.
Figure 4C:
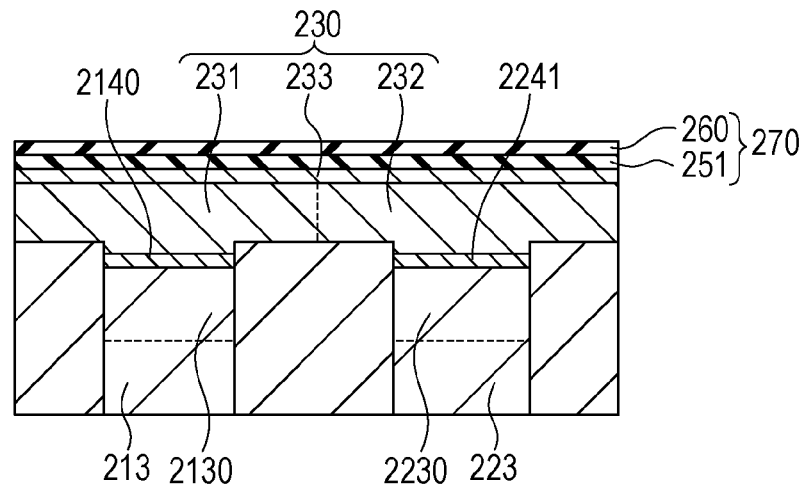
FIG. 4C is a cross-sectional schematic view of an example of a peripheral MOSFET.

FIG. 4B is a cross-sectional schematic view in the IVB-IVB line illustrated in FIG. 3B. FIG. 4C is a cross-sectional schematic view in the IVC-IVC line illustrated in FIG. 3B. Although FIG. 4B illustrates the peripheral nMOSFET 210, the peripheral pMOSFET 220 can employ the same structure except the point that the conductive type is a p-type. Therefore, FIG. 4B is described as the peripheral MOSFET.

The peripheral MOSFET of this example has a silicon oxide film 214 which functions as a gate insulating film. In detail, the silicon oxide film 214 has at least a main portion 2140 located between the gate electrode 230 and a channel region 2130 of the peripheral MOSFET. The MOS structure including the gate electrode 230, the main portion 2140, and the channel region 2130 forms the gate of the peripheral MOSFET. The channel region 2130 is a portion of a well region 213 and is a portion located between a source 211 and a drain 212 of the well region 213. The source 211 has a high concentration region 2110 and a low concentration region 2111. The drain 212 has a high concentration region 2120 and a low concentration region 2121. The low concentration region 2111 and the low concentration region 2121 each function as extension regions. On the low concentration region 2111 and the low concentration region 2121, sidewall spacers 215 are provided.

The silicon oxide film 214 of this example has the extension portions 2141 extending from the main portion 2140 onto the low concentration region 2111 of the source 211 and the low concentration region 2121 of the drain 212 of the peripheral MOSFET. The silicon oxide film 214 does not extend onto the high concentration region 2110 of the source 211 and the high concentration region 2120 of the drain 212 of the peripheral MOSFET. The extension portions 2141 are described later.

The surface at the side of the gate electrode 230 of the main portion 2140 is referred to as an upper surface of the main portion 2140. The upper surface of the main portion 2140 contacts the undersurface of the gate electrode 230 to form an interface with the gate electrode 230. The surface at the side of the channel region 2130 of the main portion 2140 is referred to as an under surface of the main portion 2140. The under surface of the main portion 2140 contacts the channel region 2130 to form an interface with the channel region 2130. The channel formed in the channel region 2130 sometimes contacts the under surface of the main portion 2140 and is sometimes formed apart from the under surface of the main portion 2140. The latter case can be achieved by forming the channel region 2130 with an buried channel structure. In the peripheral pMOSFET, the channel region 2130 is suitably formed with an buried channel structure.

The thickness of the main portion 2140 is the distance from the upper surface to the under surface of the main portion 2140 and is equal to the distance from the gate electrode 230 to the channel region 2130. The practical thickness t of the main portion 2140 is 1.0 nm or more and 15 nm or lower. The thickness of the main portion 2140 is described. The thickness $T_1$ of the main portion 2140 of the first peripheral MOSFET is smaller than the thickness $T_2$ of the main portion 2140 of the second peripheral MOSFET. Typically, the thickness $T_1$ of the first peripheral MOSFET is smaller than the thickness T of the photoelectric conversion MOSFET. Typically, the thickness $T_2$ of the second peripheral MOSFET is the same as the thickness T of the photoelectric conversion MOSFET. $T_1$ is suitably lower than 5.0 nm and also suitably 1.0 nm or more. In this example, $T_1$ is 3.8 nm and $T_2$ is 7.5 nm.

The silicon oxide film 214 contains at least nitrogen in the main portion 2140. The concentration of the nitrogen contained in the silicon oxide film 214 of this embodiment is not uniform from the upper surface to the under surface of the main portion 2140 and has a distribution in the lamination direction.

Figure 5B:
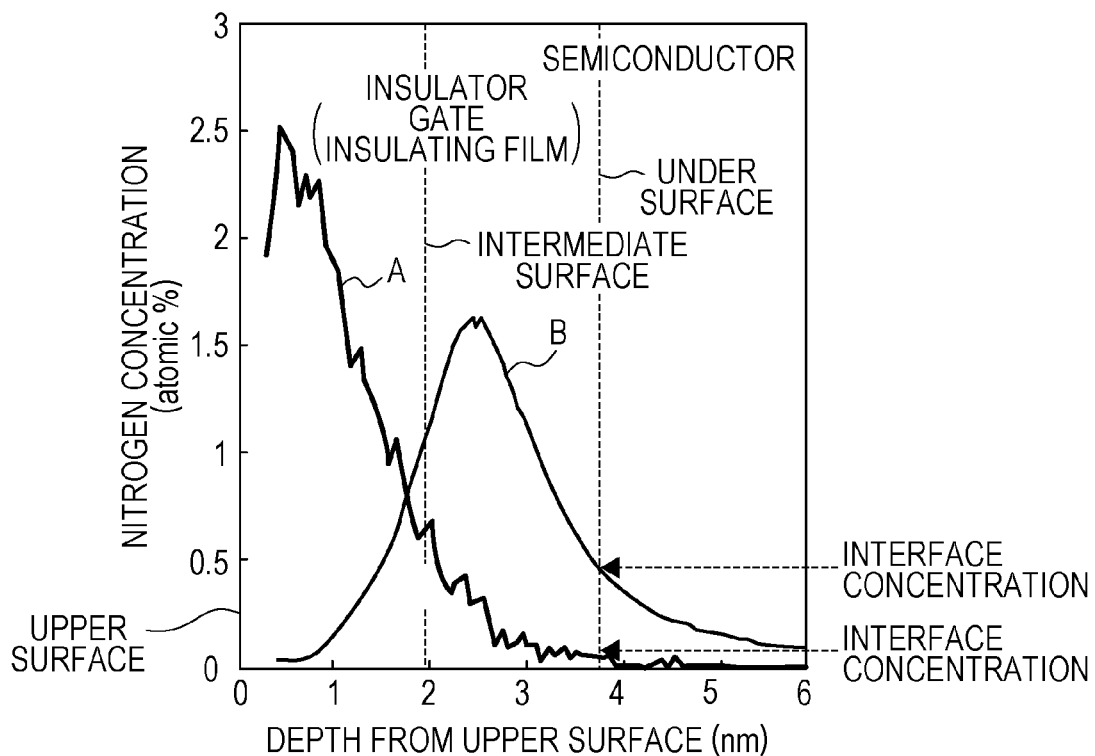

The line A of FIG. 5B illustrates an example of a distribution of the nitrogen concentration in the main portion 2140 of the first peripheral MOSFET of this embodiment. As a reference example, the line B of FIG. 5B illustrates a distribution of the nitrogen concentration when the main portion 2140 of the first peripheral MOSFET is formed using a general thermal oxynitriding method. The line A of FIG. 5A illustrates a distribution of the nitrogen concentration in the main portion 2140 of the second peripheral MOSFET of this example. In this example, the main portion 2140 of the second peripheral MOSFET has the same nitrogen concentration distribution as that of the photoelectric conversion MOSFET. As a reference example, the line B of FIG. 5A illustrates an example of a distribution of the nitrogen concentration when the main portion 2140 of the second peripheral MOSFET is formed using a general thermal oxynitriding method.

The practical peak nitrogen concentration $C_{1p}$ in the main portion 2140 of the first peripheral MOSFET is 0.50 atomic % or more. The peak nitrogen concentration $C_{1p}$ is suitably 10.00 atomic % or lower and more suitably 5.00 atomic % or lower. In this example, the peak nitrogen concentration $C_{1p}$ of the main portion 2140 of the first peripheral MOSFET is 2.55 atomic %.

The practical peak nitrogen concentration $C_{2p}$ in the main portion 2140 of the second peripheral MOSFET is 0.50 atomic % or more. The peak nitrogen concentration $C_{2p}$ is suitably 10.00 atomic % or lower and more suitably 5.00 atomic % or lower. In this example, the peak nitrogen concentration $C_{2p}$ of the main portion 2140 of the second peripheral MOSFET is 2.55 atomic %.

Thus, due to the fact that the main portion 2140 of the silicon oxide film 214 as a gate insulating film contains nitrogen, the dielectric constant of the main portion 2140 becomes high as compared with the case of using a silicon oxide film which is formed using a thermal oxidation method and substantially does not contain nitrogen. As a result, the capacity of the MOS structure can be increased irrespective of the thickness $T_1$ and the thickness $T_2$ of the main portion 2140. Therefore, the drive capability and the operation speed of the peripheral MOSFET can be improved.

The nitrogen concentration $C_{1i}$ in the under surface of the main portion 2140 of the first peripheral MOSFET, i.e., the interface nitrogen concentration, is suitably lower than 0.50 atomic % and more suitably 0.10 atomic % or lower. The interface nitrogen concentration $C_{1i}$ of this example is lower than 0.20 atomic %.

The nitrogen concentration $C_{2i}$ in the under surface of the main portion 2140 of the second peripheral nMOSFET and the second peripheral pMOSFET, i.e., the interface nitrogen concentration, is suitably 0.10 atomic % or lower and more suitably 0.05 atomic % or lower. The interface nitrogen concentration $C_{2i}$ of this example is lower than 0.05 atomic %.

Thus, by making the interface nitrogen concentration of the main portion 2140 of the silicon oxide film 214 as a gate insulating film low, the level of the interface between the main portion 2140 and the channel region 2130, i.e., the interface level, decreases. In the peripheral MOSFET in which high-speed operation is demanded, the high interface level can become a noticeable cause of 1/f noise. In this aspect, the 1/f noise can be reduced by making the interface level low.

The position where the peak nitrogen concentrations $C_{p1}$ and $C_{p2}$ are achieved in the main portion 2140 is suitably located at the gate electrode 230 side rather than a virtual surface (intermediate surface) located at the equal distance from the upper surface and the under surface of the main portion 2140. More specifically, when the distances from the upper surface of the position where the peak nitrogen concentrations $C_{p1}$ and $C_{p2}$ are achieved are defined as $D_{1p}$ and $D_{2p}$, it is suitable to satisfy $D_{1p}<T_1/2$ and $D_{2p}<T_2/2$. With respect to the position where the peak nitrogen concentrations $C_p$ is achieved, it is more suitable to satisfy $0 \leq D_{1p} \leq T_1/4$ and $0 \leq D_{2p} \leq T_2/4$. In this example, the distances $D_{1p}$ and $D_{2p}$ are lower than 1.0 nm.

The position where the nitrogen concentration reaches ½ of the peak concentrations $C_{1p}$ and $C_{2p}$ is suitably located at the gate electrode 230 side relative to the intermediate surface. More specifically, when the distances from the upper surface of the position where the nitrogen concentration reaches ½ of the peak concentrations $C_{1p}$ and $C_{2p}$ are defined as $D_{1h}$ and $D_{2h}$, it is suitable to satisfy $D_{1p}<D_{1h}<T_1/2$ and $D_{2p}<D_{2h}<T_2/2$. In this example, $D_{1h}$ and $D_{2h}$ are 1.5 mm. $D_{2h}<T_2/4$ is also satisfied.

The nitrogen concentration at the position where the distance from the upper surface of the main portion 2040 reaches $T_1/2$ and $T_2/2$, i.e., in the intermediate surface described above, is suitably lower than ½ of the peak nitrogen concentrations $C_{1p}$ and $C_{2p}$. Furthermore, it is suitable that the nitrogen concentration at the side of the channel region 2130 relative to the intermediate surface does not exceed the nitrogen concentration in the intermediate surface. The nitrogen concentration in the intermediate surface is suitably 1.00 atomic % or lower and more suitably 0.50 atomic % or lower. It is suitable that the nitrogen concentration at the side of the channel region 2130 relative to the intermediate surface does not exceed 1.00 atomic %. When the nitrogen concentration in the intermediate surface is 0.01 atomic % or lower, the width (thickness) in the depth direction of a region containing nitrogen is small. It is suitable that nitrogen is somewhat present also in the intermediate surface. The nitrogen concentration in the intermediate surface is suitably 0.01 atomic % or more and more suitably 0.05 atomic % or more. In this example, with respect to the first peripheral MOSFET, the nitrogen concentration in the intermediate surface is 0.63 atomic %, and the nitrogen concentration at the side of the channel region 2130 relative to the intermediate surface does not exceed 1.00 atomic %. In this example, with respect to the second peripheral MOSFET, the nitrogen concentration in the intermediate surface is 0.07 atomic %, and the nitrogen concentration at the side of the channel region 2130 relative to the intermediate surface does not exceed 0.10 atomic %.

Thus, it is suitable to have a concentration distribution such that the nitrogen concentration sharply decreases from the position where the peak nitrogen concentration is achieved to the intermediate surface of the main portion 2140 and the nitrogen concentration from the intermediate surface to the under surface is very low.

The extension portions 2141 are described. The extension portions 2141 each also have an upper surface and an under surface. The under surfaces of the extension portions 2141 are a surface at the side of the source 211 and a surface at the side of the drain 212 of the extension portion 2141. The extension portion 2141 may be formed on only one of the low concentration region 2111 of the source 211 and the low concentration region 2121 of the drain 212 and is sometimes not provided thereon. The under surfaces of the extension portions 2141 are located in the substantially same plane as the under surface of the main portion 2140.

Although the extension portions 2141 may have the same thickness and nitrogen concentration distribution as those of the main portion 2140, it is suitable for the extension portions 2041 to have a thickness and a nitrogen concentration distribution different from those of the main portion 2140. In this embodiment, the thickness $T_1'$ of the extension portions 2141 of the first peripheral MOSFET is smaller than the thickness $T_1$ of the main portion 2140. The thickness $T_2'$ of the extension portions 2141 of the second peripheral MOSFET is smaller than the thickness $T_2$ of the main portion 2140. In this example, the thickness $T_1'$ of the extension portions 2141 is 0.8 nm and the thickness $T_2'$ of the extension portions 2141 is 4.5 nm. The nitrogen concentration in the under surfaces of the extension portions 2141 of the first peripheral MOSFET, i.e., the interface nitrogen concentration, is 0.50 atomic % or lower and suitably 0.10 atomic % or lower. The interface nitrogen concentration in this example is lower than 0.20 atomic %. The nitrogen concentration in the under surfaces of the extension portions 2141 of the second peripheral MOSFET, i.e., the interface nitrogen concentration, is 0.10 atomic % or lower and suitably 0.50 atomic % or lower. The interface nitrogen concentration of the extension portions 2141 in this example is lower than 0.05 atomic %, which can be regarded as that the nitrogen concentration is 0 atomic %.

The peak nitrogen concentration of the extension portions 2141 is 10.00 atomic % or lower similarly as in the main portion 2140 and is suitably 1.00 atomic % or lower and more suitably 0.50 atomic % or lower. The peak nitrogen concentration of the extension portions 2141 is suitably ½ or lower of the peak nitrogen concentration of the main portion 2140. In this example, the peak nitrogen concentration of the extension portions 2141 of the first peripheral MOSFET is lower than 0.30 atomic %. In this example, the peak nitrogen concentration of the extension portions 2141 of the second peripheral MOSFET is lower than 0.20 atomic %. The position where the peak nitrogen concentration is achieved in the extension portions 2141 is suitably the upper surface of the extension portions 2141.

The gate electrode 230 of the peripheral MOSFET is described with reference to FIGS. 4B and 4C. The gate electrode 230 of the first peripheral nMOSFET 210 and the first peripheral pMOSFET 220 has an n-type portion 231 and a p-type portion 232. The n-type portion 231 contains an n-type polysilicon and corresponds to the first peripheral nMOSFET 210. More specifically, the main portion 2140 of the gate insulating film of the first peripheral nMOSFET 210 is located between the channel region 2130 and the n-type portion 231 of the first peripheral nMOSFET 210. The p-type portion 232 contains a p-type polysilicon and corresponds to the first peripheral pMOSFET 220. More specifically, the main portion 2240 of the gate insulating film of the first peripheral pMOSFET 220 is located between the channel region 2230 and the p-type portion 232 of the first peripheral pMOSFET 220. The p-type portion 232 is continuous to the n-type portion 231. Therefore, the n-type portion 231 and the p-type portion 232 can form pn junction in the gate electrode 230. The pn junction can be formed on the insulating isolation portion 310.

A first silicide layer 233 is formed on a region from the n-type portion 231 to the p-type portion 232. Thus, the n-type portion 231 and the p-type portion 232 are short-circuited by the first silicide layer 233, and the pn junction prevents the gate electrode 230 from functioning as a diode.

The impurity of the n-type portion 231 is typically phosphorus (P). A suitable range of the impurity concentration of the n-type portion 231 of the gate electrode 230 of the peripheral nMOSFET is $1\times10^{21}$ to $1\times10^{22}$ (atoms/cm$^3$) when using phosphorus (P) as impurities. A suitable range of the sheet resistance of the n-type portion 231 is 10 to 1000Ω/☐. Also when the impurity of the n-type portion 231 is nitrogen (N) or arsenic (As), the impurity concentration may be set in such a manner as to achieve the sheet resistance in the range mentioned above. When the photoelectric conversion MOSFET is an nMOSFET, the impurity concentration of the n-type portion 231 of the peripheral nMOSFET is suitably higher than the impurity concentration of the gate electrode 130 of the photoelectric conversion MOSFET. The impurity concentration of the n-type portion 231 of the peripheral nMOSFET is more suitably ⅔ or more times the impurity concentration of the gate electrode 130 of the photoelectric conversion MOSFET. The sheet resistance of the n-type portion 231 of the peripheral nMOSFET is suitably lower than the sheet resistance of the photoelectric conversion MOSFET.

The impurity of the p-type portion 232 is typically boron (B). However, boron is easily diffused, and boron may ooze out to a channel region 2230 through a main portion 2241 to cause noise in some cases. However, by compounding 0.50 atomic % or more of nitrogen in the main portion 2241 of the gate insulating film, the oozing can be suppressed. A suitable range of the impurity concentration of the p-type portion 232 of the gate electrode 230 of the peripheral pMOSFET is $1\times10^{21}$ to $1\times10^{22}$ (atoms/cm$^3$) when using boron (B) as impurities. A suitable range of the sheet resistance of the p-type portion 232 is 10 to 1000Ω/☐. Also when the impurity of the p-type portion 232 is nitrogen (N) or arsenic (As), the impurity concentration may be set in such a manner as to achieve the sheet resistance in the range mentioned above.

Although the photoelectric conversion MOSFET of this example is an nMOSFET and may be a pMOSFET. When the gate electrode 130 of the photoelectric conversion MOSFET which is an nMOSFET contains polysilicon, the gate electrode 130 is suitably a non-doped type or an n-type. When the gate electrode 130 is a p-type, boron (B) is typically an impurity. However, boron is easily diffused, which causes noise. Therefore, noise can be suppressed by making the gate electrode 130 a non-doped type or an n-type. However, when making the gate electrode 130 a non-doped type, the gate electrode 130 is easily depleted. Therefore, it is more suitable to make the gate electrode 130 an n-type. When making the gate electrode 130 of the photoelectric conversion MOSFET an n-type, a suitable range of an impurity concentration of the gate electrode 130 is $1\times10^{21}$ to $1\times10^{22}$ (atoms/cm$^3$) when using phosphorus (P) as impurities. A suitable range of the sheet resistance of the gate electrode 130 is 10 to 1000Ω/☐. When using nitrogen (N) or arsenic (As) as impurities, the impurity concentration may be determined in such a manner as to achieve the sheet resistance in this range.

The sidewall spacers 215 for the peripheral MOSFET and a laminated film covering the peripheral MOSFET illustrated in FIGS. 4B and 4C are described.

The sidewall spacers 215 contain a first silicon oxide layer 2151 and a first silicon nitride layer 2152. The first silicon oxide layer 2151 is located between the first silicon nitride layer 2152 and the gate electrode 230. The extension portions 2141 are located between the sidewall spacer 215 and the low concentration regions 2111 (2121). The first silicon oxide layer 2151 is suitably thicker than the main portion 2140 and/or the extension portion 2141. The thickness of the first silicon oxide layer 2151 is 10 nm in this example.

On the source 211, a second silicide layer 241 is formed. On the drain 212, a second silicide layer 242 is formed. The second silicide layers 241 (242) have a function of reducing the connection resistance of the source 211 and the drain 212 and a contact plug (not illustrated).

The laminated film contains a second silicon oxide layer 251 and a second silicon nitride layer 260. The second silicon oxide layer 251 which is relatively thick and covers the source 211, the gate electrode 230, and the drain 212 is formed. The second silicide layer 242 is located between the source 211 and the drain 212 and the second silicon oxide layer 251.

The thickness of the second silicon oxide layer 251 is larger than that of the first silicon oxide layer 2151 and is suitably 10 to 100 nm and is 50 nm in this example. The second silicon nitride layer 260 which is relatively thick and covers the second silicon oxide layer 251 is formed. The silicon nitride layer 260 is suitably thicker than the first silicon oxide layer 2151. The thickness of the silicon nitride layer is suitably 10 to 100 nm and is 50 nm in this example.

As described above, the photoelectric conversion section 10 contains the semiconductor element (photoelectric conversion MOSFET) having the laminated structure (MOS structure) containing the electroconductor (gate electrode 130), the semiconductor (channel region 2030), and the insulator (gate insulating film) provided between the electroconductor and the semiconductor. The insulator is the silicon oxide film 204 containing nitrogen in the main portion 2040 located between the electroconductor and the semiconductor. The maximum nitrogen concentration of the main portion 2040 is higher than 0.10 atomic % and the interface nitrogen concentration in the under surface of the main portion 2040 is 0.10 atomic % or lower. By adjusting the maximum nitrogen concentration of the main portion 2040 to 0.10 atomic % or more, a leak current between the electroconductor and the semiconductor can be reduced. By adjusting the interface nitrogen concentration of the main portion 2040 to 0.10 atomic % or lower, the interface level of the insulator and the semiconductor can be made small, and noise generated in the interface between the insulator and the semiconductor can be reduced. By adopting the laminated structure to the photoelectric conversion section, the performance of the photoelectric conversion section can be improved.

The description is mainly given taking a front surface irradiation type CMOS image sensor as an example but a rear surface irradiation type CMOS image sensor can also be employed.

The semiconductor element having the above-described laminated structure (MOS structure) is not limited to the MOSFET. For example, a charge coupled device (CCD) which transmits signal charges by the photoelectric conversion section may be acceptable and the photoelectric conversion apparatus may be used as a CCD image sensor. Moreover, a semiconductor element may be acceptable in which the photoelectric conversion portions 101 (102) which generate signal charges by the photoelectric conversion section serve as a photogate, and the photogate has the above-described laminated structure. A semiconductor element may also be acceptable in which each transistor of the photoelectric conversion unit 11 serves as an insulated gate bipolar transistor (IGBT) and the IGBT has the above-described laminated structure. A semiconductor element may also be acceptable in which an accumulation portion which accumulates signal charges of the photoelectric conversion portions 101 (102) is provided in the photoelectric conversion unit 11 similarly as in the case where the photoelectric conversion section 10 has a global electronic shutter function, and the accumulation portion has the above-described laminated structure.

The use of the photoelectric conversion apparatus as an image sensor (image pickup device) is suitable but the photoelectric conversion apparatus can also be used as a photoelectric conversion apparatus which exclusively functions as a distance meter (focal detecting device) or a photometer. Furthermore, the photoelectric conversion apparatus can also be used as a photoelectric conversion apparatus which functions as both an image pickup device and a distance meter.

Next, an example of a method for manufacturing the photoelectric conversion apparatus is described with reference to FIGS. 7 to 10. FIGS. 7 to 10 illustrate a method for manufacturing a portion equivalent to the cross section along the VII to V-VII to V line of FIG. 3A illustrating the photoelectric conversion section 10 while dividing a photoelectric conversion region CR into a plurality of portions. In detail, in the photoelectric conversion region CR, a transfer portion TX in which the transfer transistors 103 (104) are formed and an amplification portion SF in which the amplification transistors 107 (108) are formed are illustrated.

FIGS. 7 to 10 illustrate a method for manufacturing a portion equivalent to the cross section in the signal processing section 20 or the drive section 30 while dividing a peripheral region PR into a plurality of portions. In detail, in the peripheral region PR, a low-voltage portion LN in which the first peripheral nMOSFET is formed, a low-voltage portion LP in which the first peripheral pMOSFET is formed, a high-voltage portion HN in which the second peripheral nMOSFET is formed, and a high-voltage portion HP in which the second peripheral pMOSFET is formed are illustrated. In the peripheral region PR, a pad portion in which an input-and-output pad is formed and an accessory portion in which an alignment mark is formed can be further provided in addition to these portions.

Hereinafter, the manufacturing method is described in the order of processes A to M as a typical order. However, the order of the processes is not limited to the order of the processes A to M. The processes may be interchanged as required and the processes may be divided into a plurality of stages, and then another process may be performed between a preceding stage and a subsequent stage. All or some of the plurality of processes may be concurrently performed.

Process A

Figure 7A:
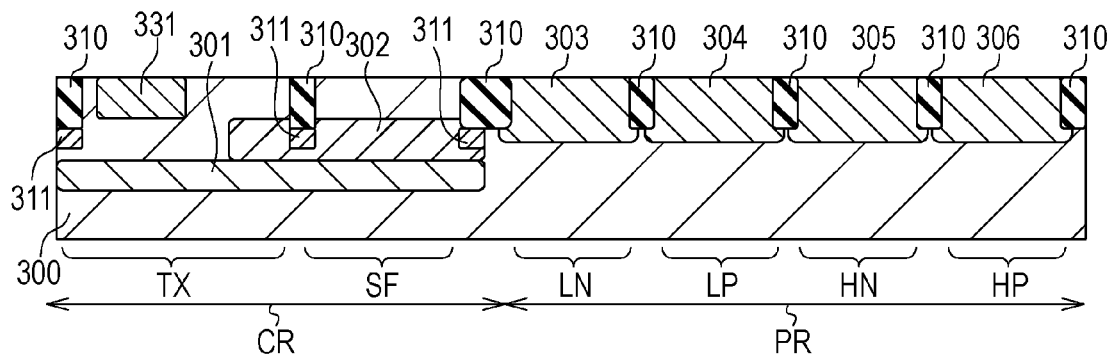
FIGS. 7A to 7C are schematic views of an example of a method for manufacturing a photoelectric conversion apparatus.

A process A (first ion implantation process) is described with reference to FIG. 7A. First, a silicon wafer 300 is prepared. The silicon wafer 300 of this example is one in which an n-type epitaxial layer is formed on a silicon base substance. As the silicon wafer 300, only an epitaxial layer portion is illustrated. On the silicon wafer 300, insulating isolation portions 310 are formed in the photoelectric conversion region CR and the peripheral region PR. Herein, the insulating isolation portions 310 have an STI (Shallow trench isolation) structure. In the formation of the insulating isolation portions 310, p-type semiconductor regions 311 for reducing noise from the lattice defect in the interface between isolation insulators are formed only in the photoelectric conversion region CR. Therefore, a p-type well 303, an n-type well 304, a p-type well 305, and an n-type well 306 are formed in the low-voltage portions LN and LP and the high-voltage portions HN and HP, respectively, of the peripheral region PR. Later, the first peripheral nMOSFET which is an n-type transistor for low voltages is formed in the p-type well 303 and the first peripheral pMOSFET which is a p-type transistor for low voltages is formed in the n-type well 304. In the p-type well 305, the second peripheral nMOSFET which is an n-type transistor for high voltages is formed and, in the n-type well 306, the second peripheral pMOSFET which is a p-type transistor for high voltages is formed.

Next, p-type semiconductor regions 301 and 302 are formed in the photoelectric conversion region CR. In the photoelectric conversion region CR, an n-type semiconductor region 331 which functions as accumulation region of the photoelectric conversion portions 101 (102) is formed. The accumulation region of the photoelectric conversion portions 101 (102) is the source of the transfer transistors 103 (104). A part of the p-type semiconductor region 301 is located in the transfer portion TX and functions as p-type regions of the photoelectric conversion portions 101 (102).

Process B-1

Figure 7B:
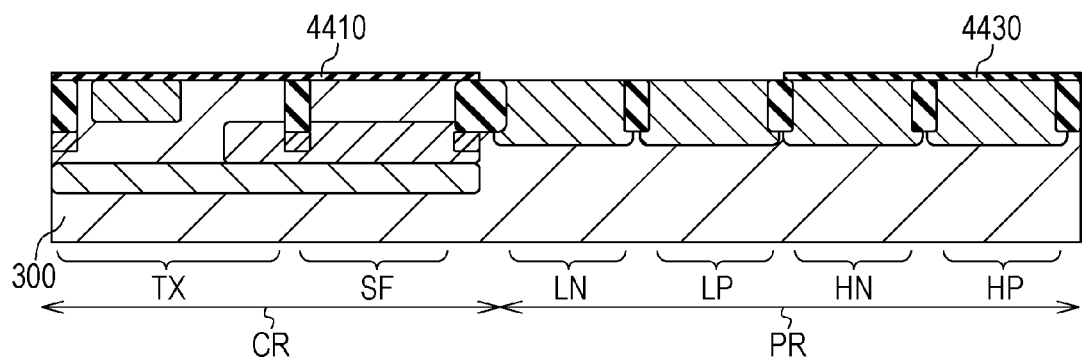

A process B (oxide film formation process) is described with reference to FIG. 7B. On the principal surface of the silicon wafer 300, a silicon oxide film is formed using a thermal oxidation method, a plasma oxidation method, or a radical oxidation method. A photoresist pattern (not illustrated) is formed on the silicon oxide film. Then, the silicon oxide film is removed from the low-voltage portion LN and the low-voltage portion LP in such a manner as to leave the silicon oxide film on the transfer portion TX, the amplification portion SF, the high-voltage portion HN, and the high-voltage portion HP using the photoresist pattern. The removal of the silicon oxide film is performed by wet etching using fluoric acid (HF), buffered hydrofluoric acid (HF, $NH_4F$, $H_2O_2$), ammonium fluoride ($NH_4F$), or the like. Then, the photoresist pattern is removed. Thus, the formation of a first silicon oxide film 4410 in the transfer portion TX and the amplification portion SF and the formation of a third silicon oxide film 4430 in the high-voltage portion HN and the high-voltage portion HP are simultaneously performed.

Process B-2

Figure 7C:
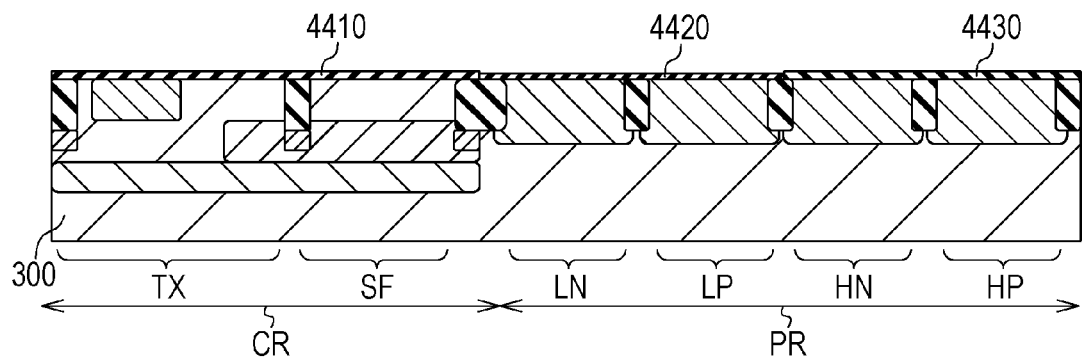

The process B (silicon oxide film formation process) is continuously described with reference to FIG. 7C. A second silicon oxide film 4420 is formed on the principal surface of the silicon wafer 300 using a thermal oxidation method, a plasma oxidation method, or a radical oxidation method. The second silicon oxide film 4420 is formed in the low-voltage portion LN and the low-voltage portion LP. The second silicon oxide film 4420 is formed in such a manner as to be thinner than the third silicon oxide film 4430. The thickness of the second silicon oxide film 4420 may be determined by adjusting the oxidation treatment time. The formation of the first to third silicon oxide films can also be performed using a sputtering method or a CVD method. However, by employing the silicon oxide film formation process (oxidation process) using an oxidation method, noise can be reduced.

Process C

Figure 8A:
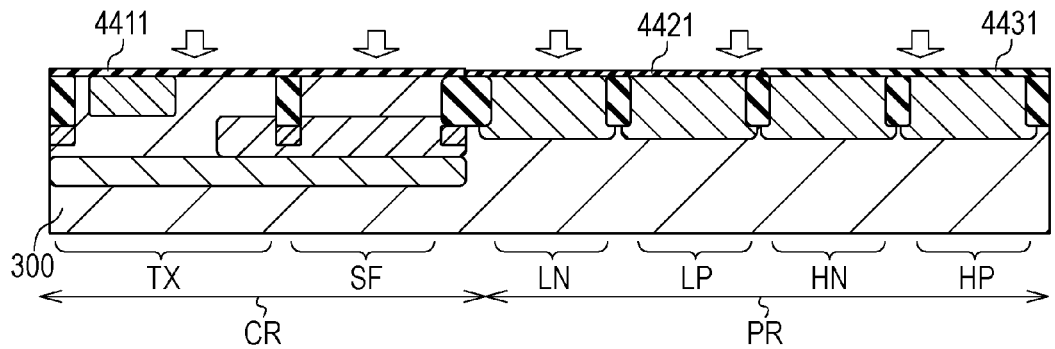
FIGS. 8A to 8C are schematic views of an example of a method for manufacturing a photoelectric conversion apparatus.

A process C (nitriding process) is described with reference to FIG. 8A. After forming the first silicon oxide film 4410, the second silicon oxide film 4420, and the third silicon oxide film 4430, the first silicon oxide film 4410, the second silicon oxide film 4420, and the third silicon oxide film 4430 are nitrided. For nitriding treatment, a plasma nitriding method is suitably used. In the nitriding treatment, the entire surface of the silicon wafer 300 is exposed to plasma.

With respect to the plasma nitriding treatment conditions, when obtaining the nitrogen concentration distributions illustrated in FIGS. 5A and 5B, for example, the following treatment conditions can be employed.
High frequency electric power: 2.45 GHz 500 W
Gas: $N_2$, Ar
Pressure: 0.05 to 5 Torr
Treatment time: 10 to 150 seconds
Stage temperature: 100 to 400° C.

The first silicon oxide film 4410, the second silicon oxide film 4420, and the third silicon oxide film 4430 each which were subjected to the nitriding treatment are referred to as silicon oxide films containing nitrogen, i.e., silicon oxynitride films. In detail, the first silicon oxide film 4410 is changed to a first silicon oxynitride film 4411, the second silicon oxide film 4420 is changed to a second silicon oxynitride film 4421, and the third silicon oxide film 4430 is changed to a third silicon oxynitride film 4431. By adjusting the plasma nitriding treatment conditions, the interface nitrogen concentration in the surface at the side of the silicon wafer 300 of the silicon oxynitride films is adjusted to 0.10 atomic % or lower. Under the conditions described above, the peak nitrogen concentration of the silicon oxynitride films is 0.50 atomic % or more. Since the suitable range and distribution of the nitrogen concentration are described above, the description thereof is omitted herein. The interface nitrogen concentration is particularly greatly influenced by the gas pressure and the treatment time among the five conditions described above. The interface nitrogen concentration is also dependent on the film thickness of the silicon oxide films to be nitrided. The interface nitrogen concentration can be made low by making the gas pressure low and shortening the treatment time. In order to obtain the nitrogen concentration distribution described above, impurities can be prevented from mixing into the silicon wafer 300 from a gate electrode and the like to be formed later by adjusting the thickness of the silicon oxide films and the nitriding treatment conditions due to the fact that the silicon oxide films contain nitrogen.

Process D

A process D (annealing process) is described. After performing the nitriding treatment, annealing treatment of the silicon wafer 300 is performed. The annealing treatment conditions are as follows, for example.
Temperature: 950 to 1150° C.
Gas: $O_2$
Pressure: 0.5 to 5 Torr
Treatment time: 5 to 30 seconds Process E-1

Figure 8B:
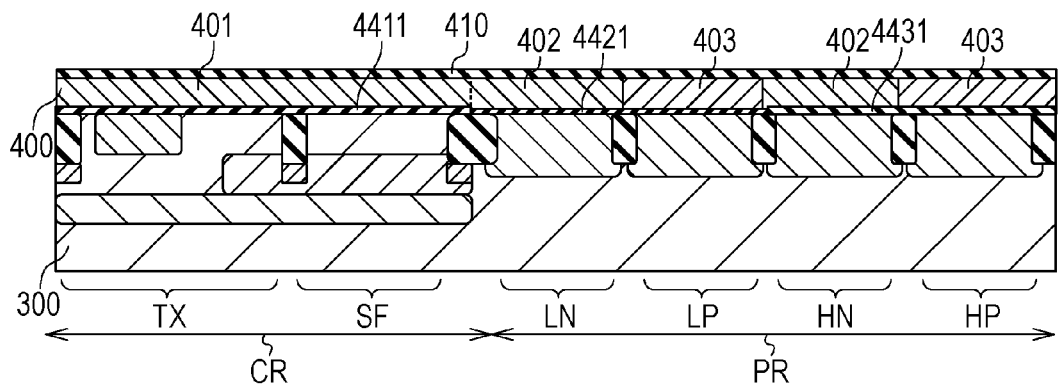

A process E (patterning process) is described with reference to FIG. 8B. On the silicon wafer 300, an electroconductor film serving as the gate electrode of the MOSFET is formed. Herein, the electroconductor film may contain other materials which are polysilicon films. In this example, a non-doped polysilicon film is formed.

Ion implantation of n-type impurities, such as nitrogen (N) and phosphorus (P), into the non-doped polysilicon film is carried out by ion implantation using a suitable photoresist pattern as a mask. This forms an n-type portion 401 in the transfer portion TX and the amplification portion SF and n-type portions 402 in the low-voltage portion LN and the high-voltage portion HN of the non-doped polysilicon film. Furthermore, ion implantation of p-type impurities, such as boron (B), into the polysilicon film is carried out by ion implantation using a suitable photoresist pattern as a mask. This forms p-type portions 403 in the low-voltage portion LP and the high-voltage portion HP of the polysilicon film. Thus, a polysilicon film 400 having the n-type portions 401 and 402 and the p-type portions 403 is obtained. When using a surface channel type, it is suitable to use such an n-type polysilicon and a p-type polysilicon as appropriate for an improvement of the properties of the peripheral MOSFET.

An inorganic insulating film 410 covering the polysilicon film 400 is formed. Although it is suitable to use silicon oxide for the material of the inorganic insulating film 410, inorganic insulation materials, such as silicon nitride and silicon carbide, can also be used.

Process E-2

Figure 8C:
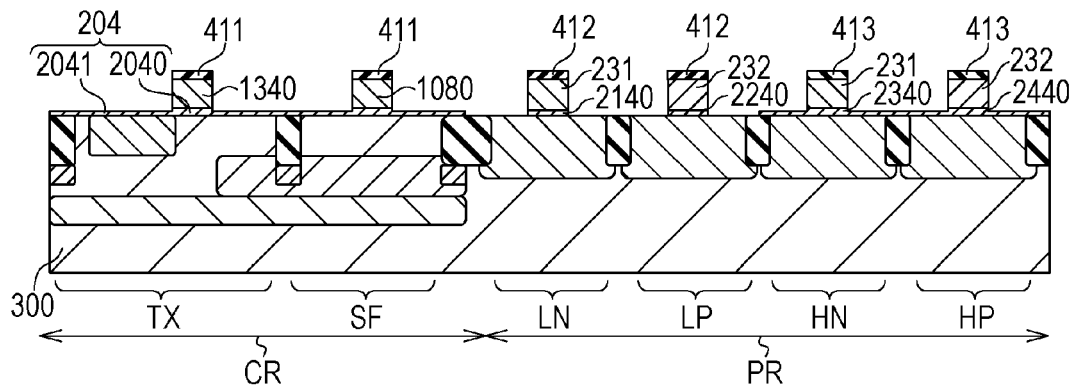

The process E (patterning process) is continuously described with reference to FIG. 8C.

A photoresist pattern is formed on the inorganic insulating film, and then the inorganic insulating film is patterned. In the photoelectric conversion region CR, first inorganic insulating members 411 containing inorganic insulation materials are formed. In the peripheral region PR, second inorganic insulating members 412 and third inorganic insulating members 413 containing inorganic insulation materials are formed. Thereafter, the photoresist pattern is removed.

The n-type portions 401 and 402 and the p-type portions 403 each are etched using each of the first inorganic insulating member 411, the second inorganic insulating member 412, and the third inorganic insulating member 413 as a mask (a so-called hard mask). For the etching, it is suitable to use dry etching having anisotropy. Thus, the n-type portion 401 is patterned to form gate electrodes 1340 and 1080 of the photoelectric conversion MOSFET. The n-type portions 402 are patterned to form the n-type portions 231 of the gate electrode 230 of the peripheral nMOSFETs. The p-type portions 403 are patterned to form the p-type portions 232 of the gate electrode 230 of the peripheral pMOSFETs. Typically, the side surface of each inorganic insulating member constitutes the side surface and the continuous surface of the corresponding gate electrode.

By the dry etching of the n-type portions 401 and 402 and the p-type portions 403, extension portions of the first silicon oxynitride film 4411, the second silicon oxynitride film 4421, and the third silicon oxynitride film 4431 are exposed. The main portion is covered with the gate electrodes. The transfer portion TX is described. For example, with respect to the dry etching treatment time of the n-type portion 401, by continuing the etching treatment after the first silicon oxynitride film 4411 is exposed, the extension portion 2041 is made thinner than the main portion 2040. More specifically, the surface of the extension portion of the first silicon oxynitride film 4411 is removed by dry etching. The first silicon oxynitride film 4411 has the peak nitrogen concentration near the surface (the polysilicon film 400 side relative to the intermediate surface) by plasma nitriding. Then, the peak nitrogen concentration of the extension portion 2041 can be made lower than that of the main portion 2040 by removing a portion near the surface of the extension portion 2041. To that end, the dry etching may be terminated in such a manner that the silicon wafer 300 is not exposed, i.e., in a state where the extension portion 2041 is left with a thickness smaller than that of the main portion 2040. Also in the peripheral region PR, the extension portion of the third silicon oxynitride film 4431 similarly becomes thin. Although the extension portion of the second silicon oxynitride film 4421 is sometimes thinly left, a possibility such that the extension portion of the second silicon oxynitride film 4421 is not left is high because the second silicon oxynitride film 4421 is thinner than the first silicon oxynitride film 4411. Therefore, FIG. 8C does not illustrate extension portions in the low-voltage portions LN and LP.

Process F

Figure 9A:
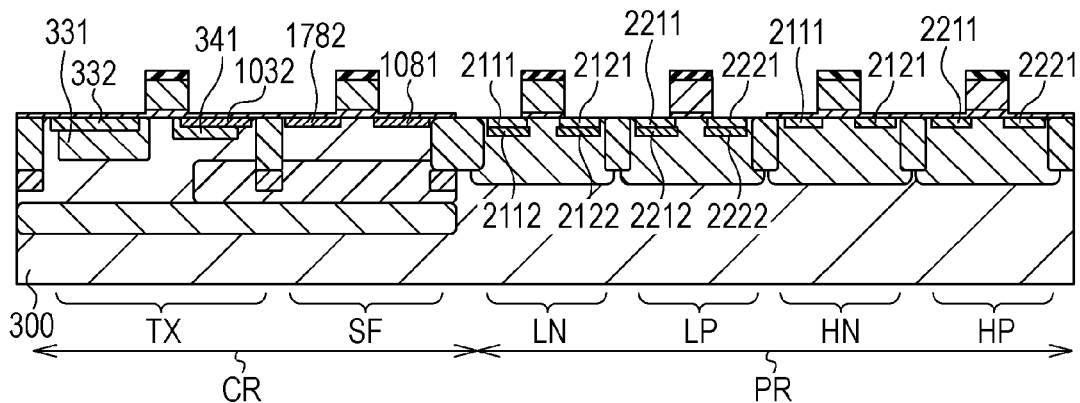
FIGS. 9A to 9C are schematic views of an example of a method for manufacturing a photoelectric conversion apparatus.

A process F (second ion implantation process) is described with reference to FIG. 9A. In this process, a semiconductor region for constituting the source and/or the drain of each transistor is formed.

At the drain side of the transfer portion TX, a p-type semiconductor region 341 is formed using oblique ion implantation in such a manner as to enter under the drain side of the gate electrode. The p-type semiconductor region 341 functions as a potential barrier region for suppressing punch through in the transfer transistors 103 (104). An n-type drain 1032 which functions as floating fusion of the transfer transistors 103 (104) is formed. At the source side of the transfer portion TX, a p-type semiconductor region 332 is formed on an n-type semiconductor region 331. The p-type semiconductor region 332 functions as a surface barrier region for preventing a dark current generated on the semiconductor surface from moving to the n-type semiconductor region 331 which functions as an accumulation region in the photoelectric conversion portions 101 (102). Thus, the photoelectric conversion portions 101 (102) become buried photodiodes. In the amplification portion SF, a drain 1782 and sources 1071 (1081) are formed.

At this time, due to the fact that the first inorganic insulating member 411 is located on the gate electrode at least in the photoelectric conversion region CR, the first inorganic insulating member 411 functions as a mask to the gate electrode, so that ion implantation into the gate electrode is suppressed. As a result, a variation in the properties of the photoelectric conversion MOSFET can be reduced.

In the low-voltage portion LN, p-type semiconductor regions 2112 and 2122 which function as a halo region of the first peripheral nMOSFET are formed. In the low-voltage portion LP, n-type semiconductor regions 2212 and 2222 which function as a halo region of the first peripheral pMOSFET are formed. In the low-voltage portion LN and the high-voltage portion HN, low concentration regions 2111 and 2121 of the source/drain of the second peripheral nMOSFET are formed. In the low-voltage portions LP and HP, low concentration regions 2211 and 2221 of the source/drain of the second peripheral pMOSFET are formed. In this example, the low concentration regions 2111 and the low concentration regions 2121, the drain 1782, and the sources 1071 (1081) are simultaneously formed by ion implantation.

Process G

Figure 9B:
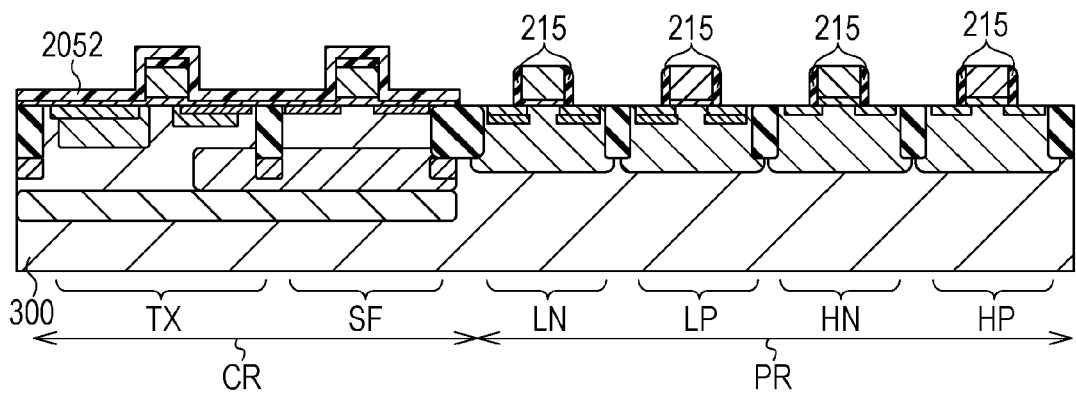

A process G (sidewall spacer formation process) is described with reference to FIG. 9B. On the entire surface of the silicon wafer 300, a thin silicon oxide layer (not illustrated) serving as the first silicon oxide layer 2051 described in FIG. 4A or the first silicon oxide layer 2151 described in FIG. 4B is formed. The thickness of the silicon oxide layer in this example is 10 nm. When the silicon oxide layer is formed by thermal oxidation of the gate electrode, there is a possibility such that the main portion of the gate insulating film is deformed in connection with the thermal oxidation, so that the properties of each MOSFET decrease. Therefore, it is suitable to form the silicon oxide layer by a CVD method. Subsequently, a silicon nitride layer serving as the first silicon nitride layer 2052 described in FIG. 4A or the first silicon nitride layer 2152 in FIG. 4B is formed on the entire surface of the silicon wafer 300 on the silicon oxide layer. The silicon nitride layer can be formed by a CVD method. A suitable photoresist pattern is formed as a mask in the photoelectric conversion region CR, and then the silicon nitride layers and the silicon oxide layers of the peripheral region RP are etched. Thus, the sidewall spacers 215 are formed in the peripheral region PR. For the etching at this time, anisotropic dry etching can be used. In the peripheral region PR, the second inorganic insulating members 412 and the third inorganic insulating members 413 provided on the upper surface of the gate electrodes become thin by the etching for forming the sidewall spacers 215. The second inorganic insulating members 412 and the third inorganic insulating members 413 may be completely removed. On the other hand, the first inorganic insulating members 411 are covered at least with a first silicon nitride layer 2052, and are still left. The extension portions of gate insulating films 2340 and 2440 become thin except portions located under the sidewalls 215 by the etching for forming the sidewall spacers 215. The extension portions of the gate insulating films 2340 and 2440 may be completely removed.

Process H

Figure 9C:
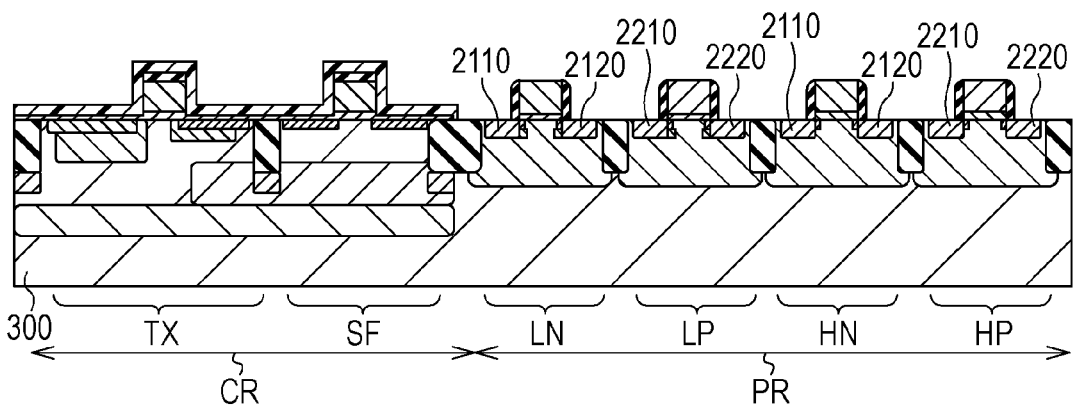

A process H (third ion implantation process) is described with reference to FIG. 9C.

In the low-voltage portion LN and the high-voltage portion HN, high concentration regions 2110 and 2120 of the source/drain are formed. In the low-voltage portion LP and the high-voltage portion HP, high concentration regions 2210 and 2220 of the source/drain are formed. Thus, the peripheral MOSFET having an LDD (Lightly Doped Drain) structure is formed. Since the second inorganic insulating members 412 and the third inorganic insulating members 413 become thin or completely removed in the previous process, almost the same amount of impurities as that in the ion implantation into the source/drain are injected into the gate electrode of the peripheral MOSFET by the ion implantation of this process. Thus, the impurity concentration of the gate electrode of the peripheral MOSFET becomes higher than the impurity concentration of the gate electrode of the photoelectric conversion MOSFET. The sheet resistance of the gate electrode of the peripheral MOSFET becomes lower than the sheet resistance of the gate electrode of the photoelectric conversion MOSFET. Thus, the performance of the peripheral MOSFET can be improved. The impurity concentration of the source/drain of the photoelectric conversion MOSFET formed in the process F is lower than the impurity concentration of the source/drain of the peripheral MOSFET. Thus, by separately forming the source/drain of the photoelectric conversion MOSFET and the source/drain of the peripheral MOSFET, the dynamic range of the amplification transistor can be improved, for example.

Process I

Figure 10A:
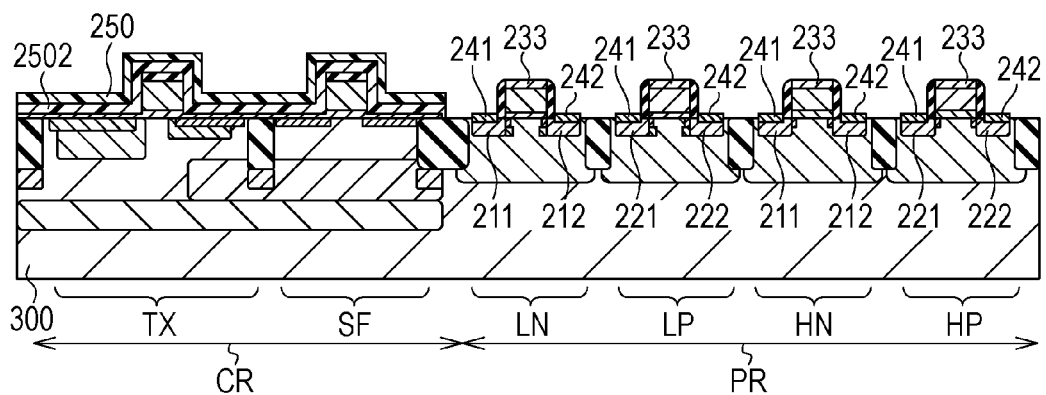
FIGS. 10A to 10C are schematic views of an example of a method for manufacturing a photoelectric conversion apparatus.

A process I (siliciding process) is described with reference to FIG. 10A. The second silicon oxide layer 250 covering the photoelectric conversion region CR is formed. The second silicon oxide layer 250 is not provided in the peripheral region PR but exposes the sources 211 and 212, the drains 212 and 222, and the gate electrodes 230 of the peripheral MOSFETs. When the second inorganic insulating members 412 and the third inorganic insulating members 413 are thinly left in the process G, the members are completely removed in this process to expose the gate electrodes 230.

Then, a metal film (not illustrated) covering the sources 211 and 212, the drains 212 and 222, and the gate electrodes 230 is formed in the peripheral region PR. The metal film contains a material which reacts with silicon to be silicided. For example, cobalt, titanium, tungsten, and the like are mentioned. Since the metal film is formed on the entire surface of the silicon wafer 300 by, for example, a sputtering method or the like, the metal film is formed also in the photoelectric conversion region CR. Thereafter, by heating the silicon wafer 300, the metal film is made to react with the n-type portions 231 and the p-type portions 232 of the gate electrodes 230 containing polysilicon of the peripheral region PR to silicide the upper surfaces of the gate electrodes 230, whereby first silicide layers 233 are formed. The sources 211 and 212 and the drains 212 and 222 of the peripheral region PR are made to react with the metal film to silicide the upper surface of the sources 211 and 212 and the drains 212 and 222. Due to the fact that the sidewall spacers 215 are provided in the peripheral MOSFET and the gate insulating film of the peripheral MOSFET does not extend onto the high concentration regions 2110, 2120, 2210, and 2220, a salicide method can be suitably applied. At this time, the second silicon oxide layer 250 is formed under the metal film formed in the photoelectric conversion region CR, so that siliciding does not occur in the photoelectric conversion region CR. The metal film which was not silicided in the photoelectric conversion region CR is removed. At least one of the photoelectric conversion MOSFETs may be subjected to siliciding. In such a case, a desired portion on the photoelectric conversion MOSFET which is subjected to siliciding may be removed.

Process J

A process J is described with reference to FIG. 10B.

Figure 10B:
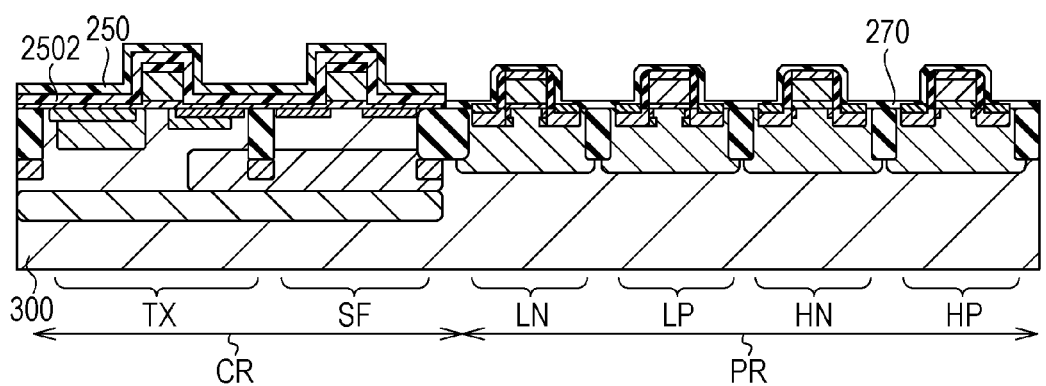

Next, a laminated film 270 as illustrated in FIG. 10B is formed. The laminated film 270 can contain the second silicon oxide layer 251 and the second silicon nitride layer 260 as illustrated in FIGS. 4B and 4C. In the peripheral PR, the laminated film 270 is formed in such a manner as to cover the first silicide layer 233 and the second silicide layers 241 and 242 of the peripheral MOSFET. The second silicon nitride layer 260 of the laminated film 270 can function as an etching stopper when forming a contact hole in a process K described later.

Process K

Figure 10C:
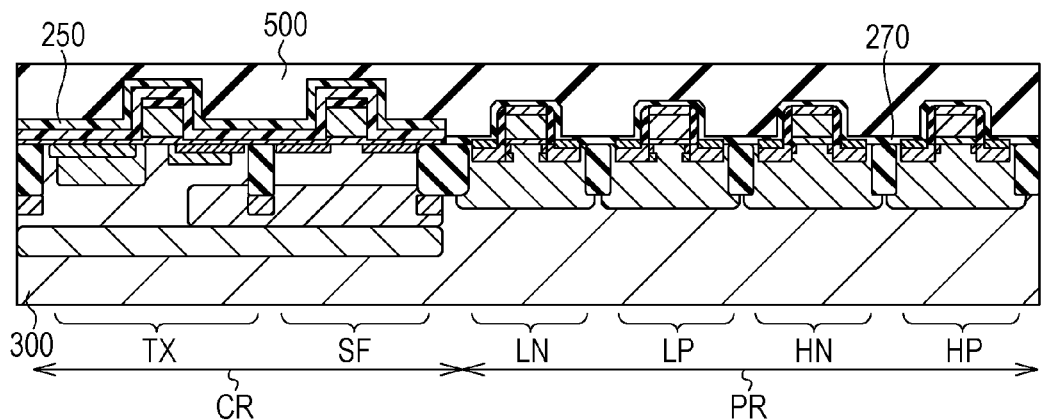

A process K (wiring process) is described with reference to FIG. 10C. An interlayer insulating layer 500 as illustrated in FIG. 10C is formed. The interlayer insulating layer 500 is a HDP (High Density Plasma) silicon oxide film in this example and may be a silicate glass film, such as PSG, BSG, and BPSG. The interlayer insulating layer 500 is flattened by known methods, such as a CMP method, a reflow method, and an etch-back method.

In the interlayer insulating layer 500, a first contact hole (not illustrated) is formed which exposes the source, the drain, and the gate electrode of the photoelectric conversion MOSFET. A metal is filled in the first contact hole to form a first contact plug (not illustrated). Subsequently, a contact hole (not illustrated) is formed which exposes the first silicide layer 233 and the second silicide layers 241 and 242 of the peripheral region PR. Then, a metal is filled in the second contact hole to form a second contact plug (not illustrated). It is a matter of course that the first contact hole and the second contact hole can be simultaneously formed to simultaneously form the first contact plug and the second contact plug. However, it is suitable to separately form them in such a manner that the metal components of the first silicide layer and the second silicide layer do not pollute the photoelectric conversion region CR. Thereafter, a wiring structure containing an aluminum wiring layer or a copper wiring layer can be formed using a known method. The vertical output lines 12 and the horizontal scanning lines 13 are included in the wiring structure.

Process L

On the silicon wafer 300, an optical unit containing a color filter array, a microlens array, and the like is formed. A waveguide structure can also be formed on the photoelectric conversion portions 101 (102).

Process M

Dicing of the silicon wafer 300 on which the photoelectric conversion section 10, the signal processing section 20, and the drive section 30 are formed as described above is carried out to divide the same into a plurality of chips. Each chip is packaged to produce the photoelectric conversion apparatus 1.

As described above, the method for manufacturing the photoelectric conversion apparatus has the silicon oxide film formation process, the nitriding process, and the patterning process. In the silicon oxide film formation process, the first silicon oxide film 4410 is formed in the photoelectric conversion region CR of the silicon wafer 300 and a second silicon oxide film 4420 is formed in the low-voltage portions LN and LP of the peripheral region CR of the silicon wafer 300. In the nitriding process, nitrogen is simultaneously introduced into the first silicon oxide film 4410 and the second silicon oxide film 4420 using a plasma nitriding method. In the patterning process, a gate electrode 1340 of the photoelectric conversion MOSFET is patterned on the first silicon oxynitride film 4411 and the gate electrodes 230 of the first peripheral nMOSFET and the first peripheral pMOSFET are patterned on the second silicon oxynitride film 4421. The nitriding process is performed in such a manner that the maximum nitrogen concentration of the first silicon oxide film 4411 reaches 0.50 atomic % or more and the interface nitrogen concentration in the surface at the side of the silicon wafer 300 of the first silicon oxide film 4441 reaches 0.10 atomic % or lower. Thus, the photoelectric conversion apparatus in which the performance of the photoelectric conversion section is improved can be provided.

Although the description above is given taking the front surface irradiation type CMOS image sensor as an example, this embodiment can be employed also for a rear surface irradiation type CMOS image sensor. When manufacturing a rear surface irradiation type photoelectric conversion apparatus, the thickness of the silicon wafer 300 is reduced to about 1 to 100 µm from the principal surface (rear surface) at the side opposite to the principal surface where the gate electrode is formed after the process K. Thereafter, an optical unit containing a microlens and a color filter is formed at the rear surface side of the silicon wafer 300. Although an example of using the photoelectric conversion apparatus as an image sensor (image pickup device) is described, the photoelectric conversion apparatus can also be used as a photoelectric conversion apparatus which exclusively functions as a distance meter (focal detecting device) or a photometer. Furthermore, the photoelectric conversion apparatus can also be used as a photoelectric conversion apparatus which functions as both an image pickup device and a distance meter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-008200 filed Jan. 18, 2012, which is hereby incorporated by reference herein in its entirety.

What is claimed is:

1. A photoelectric conversion apparatus, comprising:
a plurality of semiconductor elements disposed in a photoelectric conversion section, each of the plurality of the semiconductor elements
including an electroconductor, a semiconductor, and a silicon oxide film provided between the electroconductor and the semiconductor,
wherein the silicon oxide film contains nitrogen, a maximum nitrogen concentration of the silicon oxide film is higher than 0.10 atomic % and 10.00 atomic % or lower, and an interface nitrogen concentration in a surface at a side of the semiconductor of the silicon oxide film is 0.10 atomic % or lower.

2. The photoelectric conversion apparatus according to claim 1, wherein
the maximum nitrogen concentration of the silicon oxide film is lower than 5.00 atomic.

3. The photoelectric conversion apparatus according to claim 1, wherein
the plurality of semiconductor elements include a transfer transistor, a source of the transfer transistor being a photoelectric conversion portion,
the silicon oxide film of the transfer transistor has an extension portion extending from the silicon oxide film onto the photoelectric conversion portion,
a maximum nitrogen concentration of the extension portion is lower than the maximum nitrogen concentration of the silicon oxide film of the transfer transistor, and
an interface nitrogen concentration in a surface at a side of the photoelectric conversion portion of the extension portion is 0.10 atomic % or lower.

4. The photoelectric conversion apparatus according to claim 3 satisfying at least one of the following (a) and (b),
(a) the maximum nitrogen concentration of the extension portion is ½ or lower of the maximum nitrogen concentration of the silicon oxide film, and
(b) the maximum nitrogen concentration of the extension portion is 1.00 atomic % or lower.

5. The photoelectric conversion apparatus according to claim 3, wherein the plurality of semiconductor elements include an amplification transistor, a gate of the amplification transistor being connected to a drain of the transfer transistor, and a thickness of the extension portion is smaller than a thickness of the silicon oxide film of the amplification transistor.

6. The photoelectric conversion apparatus according to claim 5, wherein
a thickness T of the silicon oxide film of the amplification transistor is 5.0 nm or more, and a nitrogen concentration at a position where a distance from the electroconductor in the silicon oxide film is T/2, is 0.01 atomic % or more and lower than 0.50 atomic %.

7. The photoelectric conversion apparatus according to claim 1, further comprising:
a CMOS circuit including an nMOSFET and a pMOSFET, wherein
gate insulating films of the nMOSFET and the pMOSFET are silicon oxide films containing nitrogen,
a maximum nitrogen concentration of the gate insulating films is 0.50 atomic % or more and 5.0 atomic % or lower, and
an interface nitrogen concentration in surfaces at a side of channel regions of the gate insulating films is lower than 0.50 atomic %.

8. An image pickup system, comprising:
the photoelectric conversion apparatus according to claim 1; and
an image generation device which generates an image based on an output signal from the photoelectric conversion apparatus.

9. The photoelectric conversion apparatus according to claim 3, further comprising a laminated film which covers the photoelectric conversion portion in contact with the extension portion, wherein the laminated film extends to cover a drain of the transfer transistor.

10. The photoelectric conversion apparatus according to claim 3, wherein the plurality of semiconductor elements include an amplification transistor having a gate connected to a drain of the transfer transistor, and a laminated film which covers the photoelectric conversion portion in contact with the extension portion extends to cover the amplification transistor.

11. The photoelectric conversion apparatus according to claim 1, wherein the electroconductor is made of an n-type polysilicon.

12. A photoelectric conversion apparatus, comprising:
a photoelectric conversion section,
the photoelectric conversion section including a semiconductor element,
the semiconductor element having a laminated structure,
the laminated structure including an electroconductor, a semiconductor, and an insulator provided between the electroconductor and the semiconductor,
the insulator being a silicon oxide film containing nitrogen in a main portion located between the electroconductor and the semiconductor,
a maximum nitrogen concentration of the main portion being higher than 0.10 atomic %, and
an interface nitrogen concentration in a surface at a side of the semiconductor of the main portion being 0.10 atomic % or lower;
a signal processing section that processes a signal from the photoelectric conversion section; and
a CMOS circuit of the signal processing section including an nMOSFET and a pMOSFET, wherein
gate insulating films of the nMOSFET and the pMOSFET are silicon oxide films containing nitrogen,
a maximum nitrogen concentration of the gate insulating films is 0.50 atomic % or more and 5.0 atomic % or lower, and
an interface nitrogen concentration in surfaces at a side of channel regions of the gate insulating films is lower than 0.50 atomic %, and
wherein
in the CMOS circuit, gate electrodes of the nMOSFET and the pMOSFET contain an n-type portion containing an n-type polysilicon corresponding to the nMOSFET and a p-type portion containing a p-type polysilicon corresponding to the pMOSFET and continuous to the n-type portion,
a first silicide layer is provided on a region from the n-type portion to the p type portion, and
a second silicide layer is provided on each of a source and a drain of each of the nMOSFET and the pMOSFET.

13. The photoelectric conversion apparatus according to claim 7, wherein
the nMOSFET contains a first nMOSFET and a second nMOSFET,
the pMOSFET contains a first pMOSFET and a second pMOSFET, and
a thickness of gate insulating films of the first nMOSFET and the first pMOSFET is smaller than a thickness of gate insulating films of the second nMOSFET and the second pMOSFET.

14. The photoelectric conversion apparatus according to claim 13, wherein
a maximum nitrogen concentration of the gate insulating films of the first nMOSFET and the first pMOSFET is 0.50 atomic % or more and an interface nitrogen concentration in surfaces at the side of the channel regions of the gate insulating films is lower than 0.50 atomic % and a maximum nitrogen concentration of the gate insulating films of the second nMOSFET and the second pMOS-FET is 0.50 atomic % or more and an interface nitrogen concentration in surfaces at the side of the channel regions of the gate insulating films is 0.10 atomic % or lower.

15. The photoelectric conversion apparatus according to claim 13, wherein a thickness of the gate insulating films of the first nMOSFET and the first pMOSFET is lower than 5.0 nm.

16. A photoelectric conversion apparatus having a photoelectric conversion section and a signal processing section which processes a signal from the photoelectric conversion section, comprising:
    a semiconductor element having a first MOS structure in the photoelectric conversion section; and
    a semiconductor element having a second MOS structure in the signal processing section, wherein
    insulators of the first MOS structure and the second MOS structure are silicon oxide films containing nitrogen in a main portion located between an electroconductor and a semiconductor, the insulators of the first MOS structure and the second MOS structure having a first surface at a side of the electroconductor and a second surface at a side of the semiconductor,
    a thickness $T_b$ of the main portion of the second MOS structure is smaller than a thickness $T_a$ of the main portion of the first MOS structure,
    a maximum nitrogen concentration of the main portions of the first MOS structure and the second MOS structure is higher than 0.10 atomic %,
    a nitrogen concentration at a first position where a distance from the first surface in the main portion of the first MOS structure is $T_a/2$, is lower than a nitrogen concentration at a second position where a distance from the first surface in the main portion of the second MOS structure is $T_b/2$, and
    an interface nitrogen concentration in the second surfaces of the main portions of the first MOS structure and the second MOS structure is 0.10 atomic % or lower.

17. The photoelectric conversion apparatus according to claim 16, wherein
    the maximum nitrogen concentration of the main portions of the first MOS structure and the second MOS structure is lower than 5.00 atomic %.

18. The photoelectric conversion apparatus according to claim 16, further comprising
    a semiconductor element having a third MOS structure in the signal processing section, wherein
    an insulator of the third MOS structure is a silicon oxide film containing nitrogen in a main portion located between an electroconductor and a semiconductor,
    a thickness $T_c$ of the main portion of the third MOS structure is larger than the thickness of the main portion of the second MOS structure,
    a maximum nitrogen concentration of the main portion of the third MOS structure is higher than 0.10 atomic % or more and 10.00 atomic % or lower, and
    an interface nitrogen concentration in a surface at a side of the semiconductor of the main portion of the third MOS structure is 0.10 atomic % or lower.

19. An image pickup system, comprising:
    photoelectric conversion apparatus according to claim 16; and
    an image generation device which generates an image based on an output signal from the photoelectric conversion apparatus.

20. The photoelectric conversion apparatus according to claim 16, wherein the nitrogen concentration at the first position is ½ or less of the maximum nitrogen concentration of the main portions of the first MOS structure.

21. The photoelectric conversion apparatus according to claim 16, wherein the nitrogen concentration at the second position is 0.50 atomic % or lower and 0.05 atomic % or more.

22. The photoelectric conversion apparatus according to claim 16, wherein the nitrogen concentration at the first position and the second position is 1.00 atomic % or lower.

23. The photoelectric conversion apparatus according to claim 16, wherein an electroconductors of the first MOS structure and the second MOS structure are made of an n-type polysilicon.

* * * * *